(12) United States Patent
Hwang

(10) Patent No.: US 8,822,969 B2
(45) Date of Patent: Sep. 2, 2014

(54) SEMICONDUCTOR MEMORY DEVICES AND METHODS OF FORMING THE SAME

(75) Inventor: Youngnam Hwang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 318 days.

(21) Appl. No.: 13/297,849

(22) Filed: Nov. 16, 2011

(65) Prior Publication Data

US 2012/0217463 A1    Aug. 30, 2012

(30) Foreign Application Priority Data

Feb. 28, 2011  (KR) .................. 10-2011-0017870

(51) Int. Cl.
  *H01L 47/00*      (2006.01)
(52) U.S. Cl.
  USPC ...... 257/4; 257/5; 257/E45.002; 257/E45.003
(58) Field of Classification Search
  CPC ..... H01L 27/2481; H01L 45/04; H01L 45/06; H01L 45/126
  USPC ........................ 257/4, 5, E45.002, E45.003
  See application file for complete search history.

(56) References Cited

U.S. PATENT DOCUMENTS

| 7,112,836 | B2 | 9/2006 | Chen |
| 7,422,926 | B2 | 9/2008 | Pellizzer et al. |
| 2006/0091492 | A1 | 5/2006 | Lee et al. |
| 2006/0097341 | A1 | 5/2006 | Pellizzer et al. |
| 2010/0163827 | A1 | 7/2010 | Kim et al. |
| 2011/0186798 | A1* | 8/2011 | Kwon et al. ............... 257/2 |

FOREIGN PATENT DOCUMENTS

KR          100833505          5/2008

\* cited by examiner

*Primary Examiner* — Minh-Loan T Tran
(74) *Attorney, Agent, or Firm* — F. Chau & Associates, LLC

(57) ABSTRACT

A semiconductor memory device is provided. The semiconductor memory device includes a variable resistive pattern, a lower electrode structure, a heating electrode. The heating electrode includes first, second and plate portions. The first portion is extended in a first direction. The second portion is upwardly protruded from a central region of a top surface of the first portion and is in contact with the variable resistive pattern. The plate portion is extended from a lower end of the first portion in a second direction perpendicular to the first direction. The plate portion is in contact with the lower electrode structure.

14 Claims, 43 Drawing Sheets

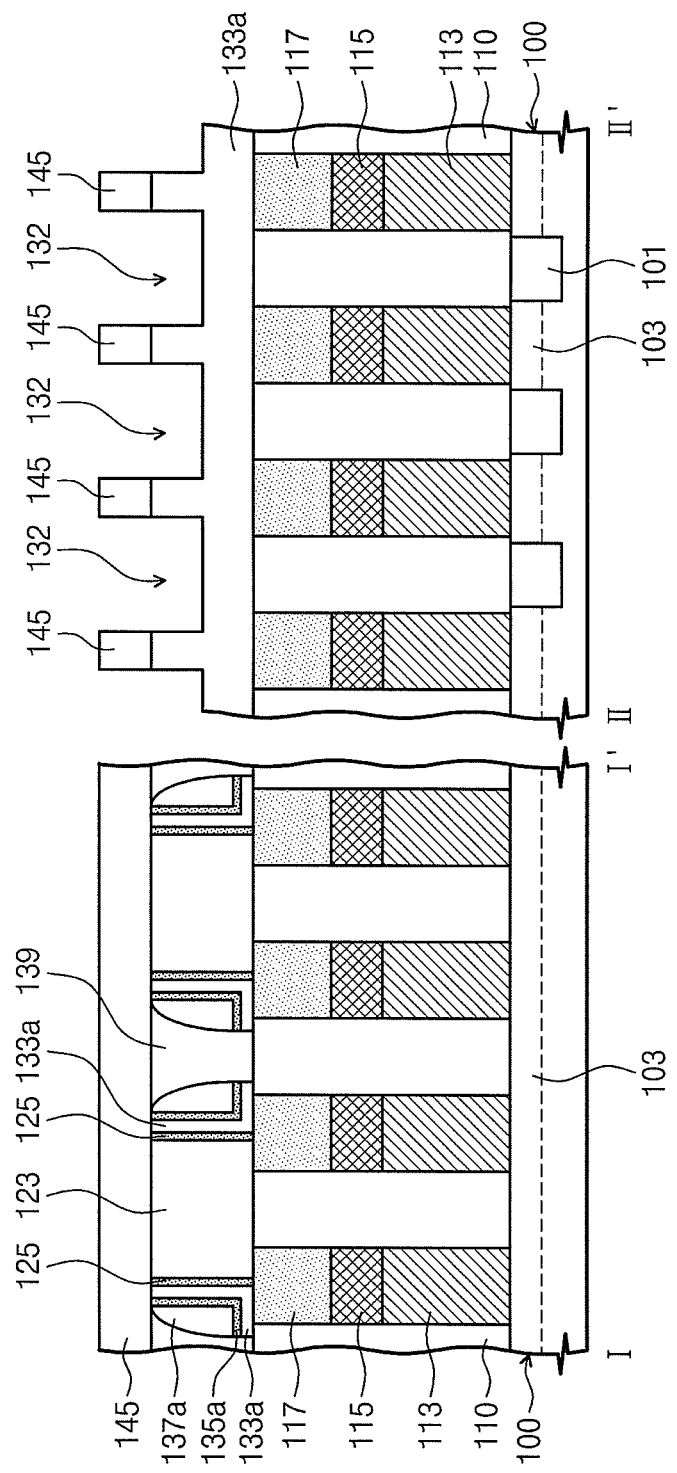

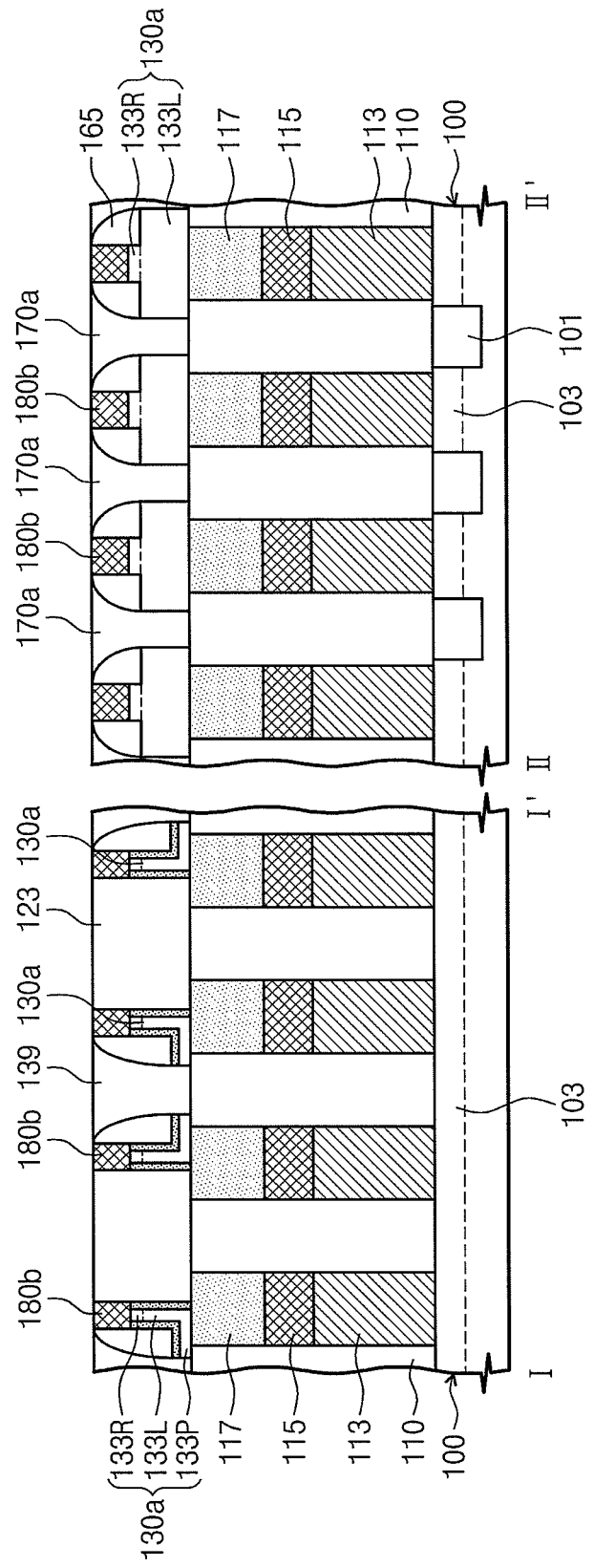

SEMICONDUCTOR MEMORY DEVICES AND METHODS OF FORMING THE SAME

CROSS-REFERENCE TO RELATED APPLICATIONS

This U.S. non-provisional patent application claims priority under 35 U.S.C. §119 to Korean Patent Application No. 10-2011-0017870, filed on Feb. 28, 2011, the entirety of which is incorporated by reference herein.

TECHNICAL FIELD

The present disclosure herein relates to semiconductor devices and, more particularly, to semiconductor memory devices including variable resistive patterns and methods of forming the same.

DESCRIPTION OF RELATED ART

Variable resistive materials are used in ferroelectric random access memory (FRAM) devices, magnetic random access memory (MRAM) devices, and phase change random access memory (PRAM) devices. The variable resistive materials can change their phase according to the amount of current. The current amount can be determined by a contact area where the variable resistive materials meet its corresponding electrode. As devices shrink their size, a device structure and a manufacturing method thereof are required to maintain the phase change property and its contact resistance of the corresponding electrode.

SUMMARY

In an embodiment of the inventive concept, a semiconductor memory device comprises a variable resistive pattern, a lower electrode structure, and a heating electrode. The heating electrode comprises a first portion extending in a first direction, a second portion upwardly protruding from a central region of a top surface of the first portion and contacting the variable resistive pattern, and a plate portion extending from a lower end of the first portion in a second direction perpendicular to the first direction and contacting the lower electrode structure.

First width of the first portion is equal to that of the second portion in the first direction, and second width of the first portion is smaller than that of the second portion in the second direction.

The variable resistive pattern has a line shape extending in the second direction. The variable resistive pattern includes an extension that downwardly protrudes from a bottom surface of the variable resistive pattern to contact the top surface of the second portion of the heating electrode. The second portion of the heating electrode includes a pair of sidewall spacers located in the second direction and disposed on either sidewalls of the second portion, and the second portion of the heating electrode further includes a mold spacer located in the first direction and disposed on the plate portion, the first portion, and second portion. The top surface of the second portion of the heating electrode is substantially coplanar with uppermost ends of the sidewall spacers and the mold spacer. The top surface of the second portion of the heating electrode is located at a lower level than uppermost ends of the sidewall spacers, and the variable resistive pattern is disposed in a recessed region defined by the pair of sidewall spacers and the top surface of the second portion of the heating electrode. A top surface of the variable resistive pattern is substantially coplanar with the uppermost ends of the sidewall spacers.

The lower electrode includes a conductive pad and an ohmic pattern, the conductive pad being disposed between the plate portion and the ohmic pattern. A selection element is disposed between the substrate and the ohmic pattern, and an upper electrode is disposed on the variable resistive pattern.

In another embodiment of the inventive concept, a method of forming a semiconductor memory device comprises a step of forming an electrode pattern extending in a first direction on a substrate, a step of forming a pair of mask patterns on the electrode pattern, the mask patterns extending a second direction perpendicular to the first direction, a step of partially etching the electrode pattern using the pair of mask patterns as etch masks to form a first recessed region in the electrode pattern, a step of forming a pair of sidewall spacers on either inner sidewalls of the first recessed region, a step of etching the electrode pattern of the first recessed region using the pair of sidewall spacers as etch masks to form a heating electrode contacting the pair of sidewall spacers, and a step of forming a variable resistive pattern on the heating electrode.

The sidewall spacers include a dielectric material having an etch selectivity with respect to the mask patterns. The step of forming the electrode pattern comprises a step of forming a pair of mold patterns defining a groove disposed between the pair of mold patterns on the substrate, a step of forming a heating electrode layer on the substrate having the mold patterns, a step of forming a pair of mold spacers on either inner sidewalls of the groove, and a step of etching the heating electrode layer using the mold spacers as etch masks to remove the heating electrode layer on top surfaces of the mold patterns and the heating electrode layer disposed between the mold patterns.

In yet another embodiment of the inventive concept, a semiconductor memory device comprises an active region having a first lower electrode structure and a second electrode structure, a mold pattern partially disposed on the first lower electrode structure and the second lower electrode structure, a pair of heating electrodes disposed on the first lower electrode structure and the second lower electrode respectively, the heating electrodes locating the opposite side of each other, having the mold pattern disposed between the first and the second lower electrode structures, and having a first contact area with the corresponding lower electrode structures, and a variable resistive pattern running on the heating electrodes and the mold pattern positioned between the heating electrodes, wherein each heating electrodes has a second contact area with the variable resistive pattern, the second contact area being less than the first contact area.

The heating electrodes have a L-shaped cross-section and a mirror imaged L-shaped cross-section at a first direction, respectively. The heating electrodes have an upside-down T-shaped cross-section at a second direction perpendicular to the first direction. The L-shaped cross section of the heating electrodes is disposed between a first capping pattern and a second capping pattern, wherein the first capping pattern contacts a sidewall of the mold pattern. A mold spacer is disposed on the second capping pattern. An upwardly protruding portion of the upside-down T-shaped cross section has sidewall spacers on either side of the upwardly protruding portion. A wordline is disposed in an upper region of the active region.

BRIEF DESCRIPTION OF THE DRAWINGS

The inventive concept will become more apparent in view of the attached drawings and accompanying detailed description.

FIGS. 2A to 4A are plan views illustrating embodiments of semiconductor memory devices according to embodiments of the inventive concept.

FIGS. 2B to 4B are merged cross sectional views taken along lines I-I' and II-II' of FIGS. 2A to 4A, respectively, to illustrate embodiments of semiconductor memory devices according to embodiments of the inventive concept.

FIGS. 5A to 15A are plan views illustrating a method of forming a semiconductor memory device according to an embodiment of the inventive concept.

FIGS. 5B to 8B are cross sectional views taken along lines I-I' of FIGS. 5A to 8A, respectively, to illustrate a method of forming a semiconductor memory device according to an embodiment of the inventive concept.

FIGS. 9B to 15B are merged cross sectional views taken along lines I-I' and II-II' of FIGS. 9A to 15A, respectively, to illustrate a method of forming a semiconductor memory device according to an embodiment of the inventive concept.

FIGS. 19B and 20B are merged cross sectional views taken along lines I-I' and II-II' of FIGS. 19A and 20A, respectively, to illustrate still another embodiment of methods of forming semiconductor memory devices according to embodiments of the inventive concept.

Common reference numerals are used throughout the drawings and the detailed description to indicate the same elements.

DETAILED DESCRIPTION OF THE EMBODIMENTS

Figure 1A:
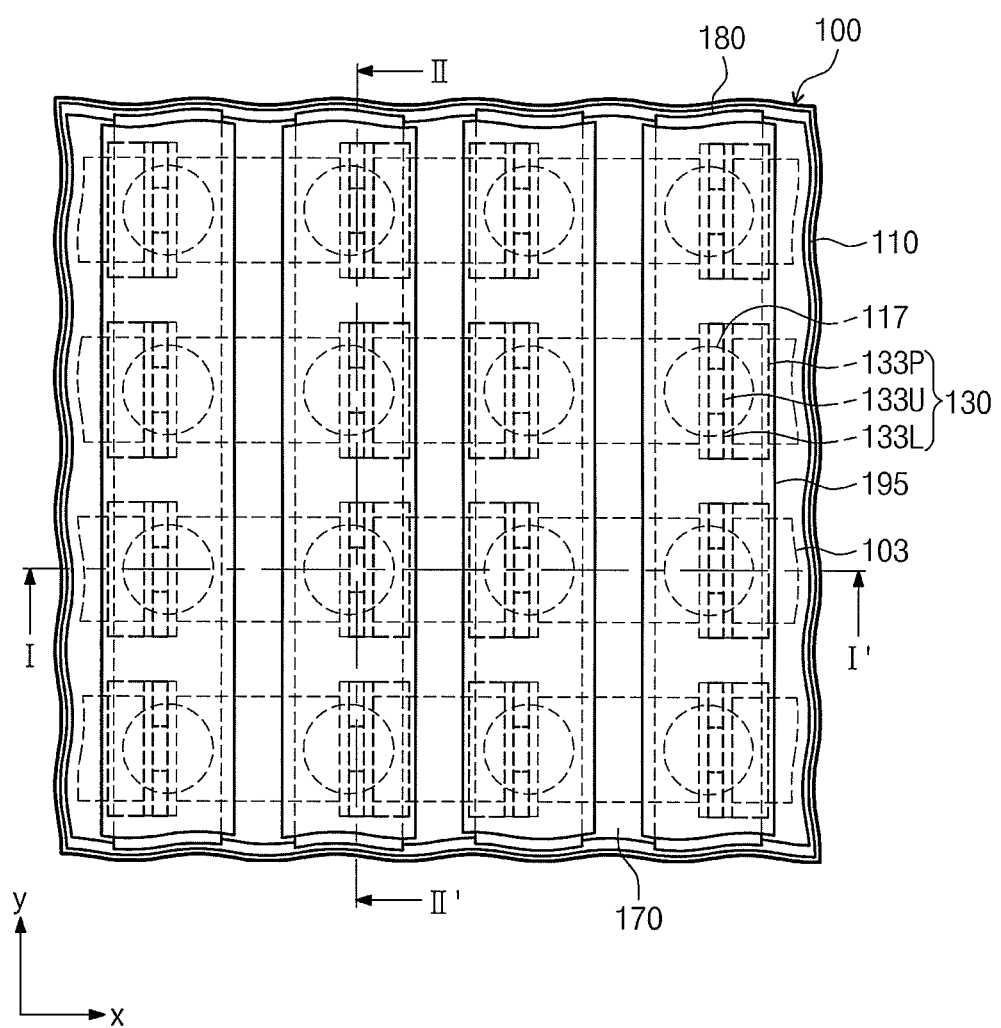
FIG. 1A is a plan view illustrating a semiconductor memory device according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various different forms. Rather, these embodiments are provided so that this disclosure will be thorough and complete, and will fully convey the scope of the invention to those skilled in the art.

The terminology used herein is for the purpose of describing particular embodiments only and is not intended to limit the invention. As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Similarly, it will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

Exemplary embodiments of the inventive concept will be described with reference to cross sectional views, perspective views and/or schematic block diagrams as ideal exemplary views of the inventive concept. In the drawings, embodiments of the inventive concept are not limited to the specific examples provided herein and are exaggerated for clarity. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Figure 1B:
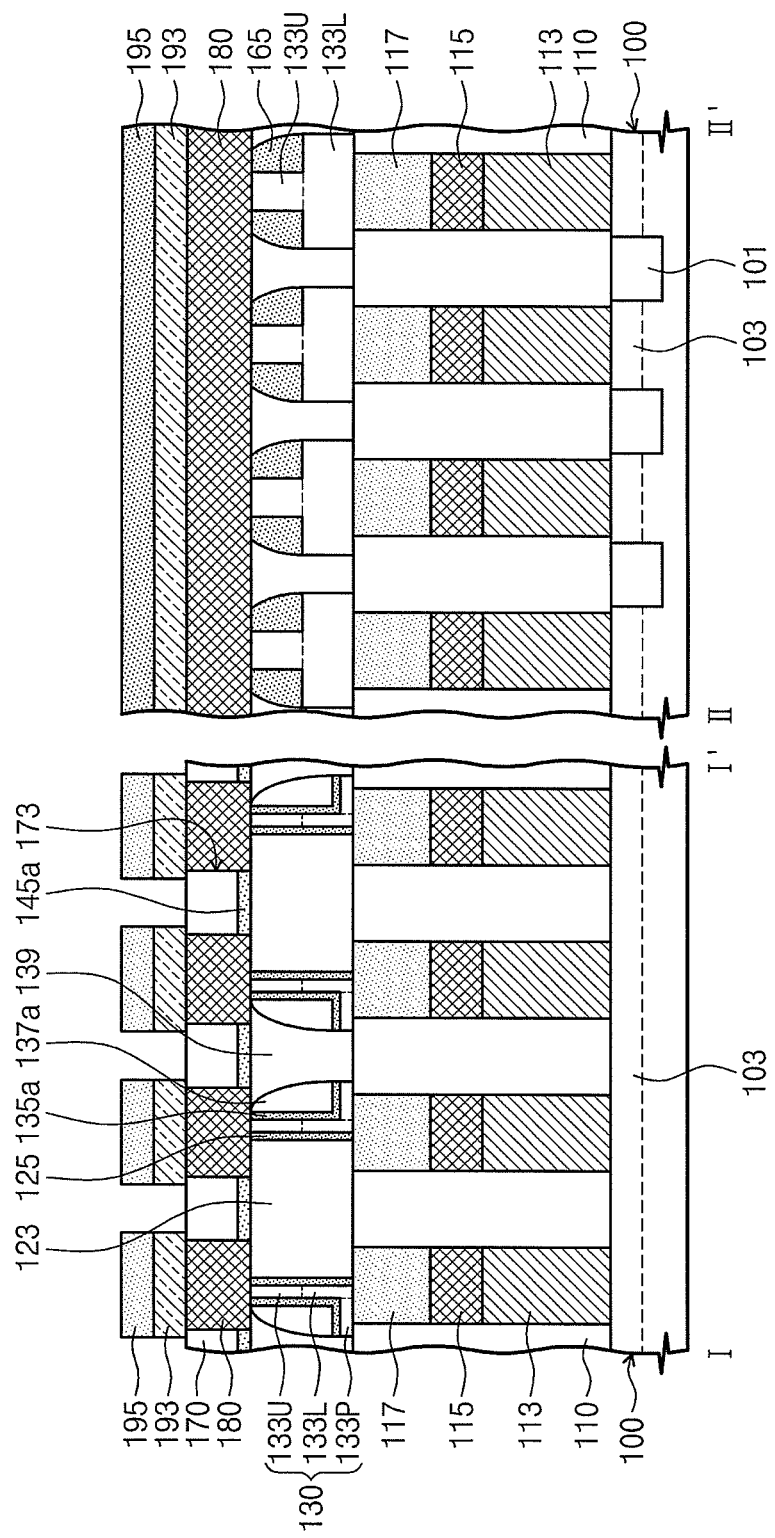
FIG. 1B is a merged cross sectional view taken along lines I-I' and II-II' of FIG. 1A to illustrate a semiconductor memory device according to embodiments of the inventive concept.
Figure 1C:
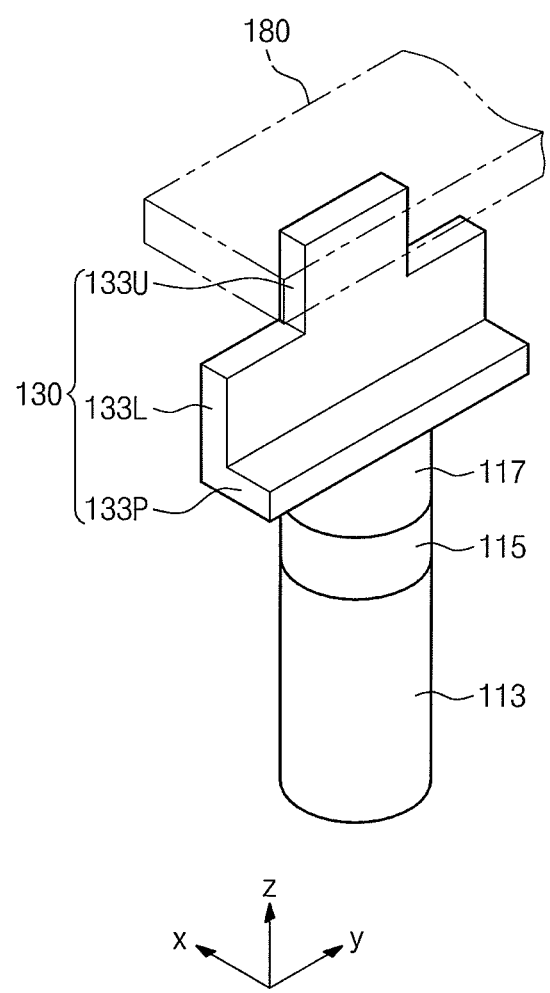
FIG. 1C is a perspective view illustrating a portion of a semiconductor memory device according to embodiments of the inventive concept.

A semiconductor memory device according to an embodiment of the inventive concept will now be described more fully hereinafter with reference to FIGS. 1A, 1B and 1C. FIG. 1A is a top plan view of a layout structure for illustrating a semiconductor memory device according to embodiments of the inventive concept, and FIG. 1B is a merged cross sectional view taken along lines I-I' and II-II' of FIG. 1A to illustrate a semiconductor memory device according to embodiments of the inventive concept. FIG. 1C is a partially perspective view illustrating a semiconductor memory device according to embodiments of the inventive concept.

Referring to FIGS. 1A and 1B, an isolation pattern 101 may be disposed in a substrate 100 to define active regions. The substrate 100 may include a semiconductor substrate. For example, the substrate 100 may include a silicon substrate, a germanium substrate or a silicon-germanium substrate. Each of the active regions may correspond to a portion of the substrate 100, which is surrounded by the isolation pattern 101. The active regions may be doped with dopants of a first conductivity type. Each of the active regions may have a line shape extending in a first direction. The first direction may be parallel with an X-axis illustrated in FIG. 1A. The isolation pattern 101 may include an insulating material. For example, the isolation pattern 101 may include at least one of an oxide material, a nitride material and an oxynitride material.

Word lines 103 may be disposed in the corresponding active regions. The word lines 103 may be formed by doping an upper portion of the active regions with dopants of a second conductivity type. One of the first and second conductivity types may be an N-type, and the other may be a P-type. In an embodiment, the active regions may be doped with P-type dopants, and the word lines 103 may be doped with N-type dopants.

A first interlayer dielectric layer 110 may be disposed on the substrate. The first interlayer dielectric layer 110 may include at least one of an oxide material, a nitride material and an oxynitride material.

Selection elements 113 may be disposed in the first interlayer dielectric layer 110. The selection elements 113 may be electrically connected to the word lines 103. In an embodiment, the selection elements 113 may be in contact with the word lines 103. Top surfaces of the selection elements 113 may be at a lower level than a top surface of the first interlayer dielectric layer 110. In an embodiment, each of the selection elements 113 may include a diode.

The number of the selection elements 113 may be two or more, and the selection elements 113 may be disposed on the active regions. The selection elements 113 may be arrayed in a two dimension along the first direction and a second direction perpendicular to the first direction in a top plan view. That is, the selection elements 113 may be disposed in a plurality of rows and in a plurality of columns. The rows may be parallel to the first direction, and the columns may be parallel to the second direction. The second direction may be a Y-axis illustrated in FIG. 1A. In an embodiment, each selection elements 113 arrayed in a column may be disposed on different active regions.

An ohmic pattern 115 and a conductive pad 117 may be sequentially stacked on each of the selection elements 113. The selection elements 113, the ohmic patterns 115 and the conductive pads 117 may be sequentially stacked to penetrate the first interlayer dielectric layer 110. However, the inventive concept is not limited to the above configuration of the selection elements 113, the ohmic patterns 115 and the conductive pads 117. For example, the selection elements 113 may correspond to planar transistors formed on and in the substrate 100. In this case, the first interlayer dielectric layer 110 may cover the planar transistors, and the conductive pads 117 may penetrate the first interlayer dielectric layer 110 to be electrically connected to the planar transistors.

In an embodiment, each of the ohmic patterns 115 may include a metal-semiconductor compound material. For example, each of the ohmic patterns 115 may include a cobalt-semiconductor compound material (for example, a cobalt silicide layer), a nickel-semiconductor compound material (for example, a nickel silicide layer) and/or a titanium-semiconductor compound material (for example, a titanium silicide layer). Each of the conductive pads 117 may include a metal layer. For example, each of the conductive pads 117 may include a tungsten layer.

Heating electrodes 130 may be disposed on the corresponding conductive pads 117. The heating electrodes 130 may be formed of a conductive material having a low resistivity. For example, the heating electrodes 130 may include a conductive metal nitride material (for example, a titanium nitride (TiN) layer, a tantalum nitride (TaN) layer and/or a titanium-aluminum nitride (TiAlN) layer) or a conductive metal-carbon compound material (for example, a titanium carbide layer). The heating electrodes 130 may be electrically connected to the selection elements 113 through the conductive pads 117 and the ohmic patterns 115.

Hereinafter, the heating electrode 130 will be described in more detail with reference to FIG. 1C. FIG. 1C is a perspective view illustrating the selection element 113, the ohmic pattern 115, the conductive pad 117, the heating electrode 130 and a variable resistive pattern 180 of the semiconductor device according to the embodiments of the inventive concept.

Referring to FIG. 1C, the heating electrode 130 may include a first portion 133L extending in the second direction and a second portion 133U on the first portion 133L.

Moreover, the heating electrode 130 may further include a plate portion 133P contacting the conductive pad 117. The plate portion 133P may extend from a lower end of the first portion 133L in the first direction. In other words, the first portion 133L may extend from an edge the plate portion 133P in a third direction. The third direction may correspond to a direction parallel with a Z-axis of FIG. 1C which is perpendicular to both the first direction and the second direction. That is, the heating electrode 130 may have an L-shaped configuration in a cross sectional view which is parallel with an X-Z plane (a plane with the first direction and the third direction). In an embodiment, the plate portion 133P may contact a portion of a top surface of the conductive pad 117.

The second portion 133U of the heating electrode 130 may be configured to protrude from a central region of the first portion 133L in the third direction. A width of the second portion 133U along the second direction may be less than a width of the first portion 133L along the second direction. Further, a width of the second portion 133U along the first direction may be substantially equal to a width of the first portion 133L along the first direction. Thus, a top surface of the first portion 133L may be divided into a pair of separated edges by the second portion 133U. A width of the second portion 133U along the first direction may be less than a width of the second portion 133U along the second direction. That is, a top surface of the second portion 133U may have a rectangular shape.

Referring again to FIGS. 1A, 1B and 1C, mold patterns 123 may be disposed on the first interlayer dielectric layer 110. Each of the mold patterns 123 may be disposed between the pair of heating electrodes 130 which are adjacent to each other in the first direction. The mold patterns 123 may have a line shape extending in the second direction. Each of the mold patterns 123 may contact a portion of the top surface of the conductive pad 117.

The heating electrodes 130 may be two dimensionally arrayed in the rows and in the columns on the first interlayer dielectric layer 110, like the conductive pads 117. The heating electrodes 130 disposed in the pair of adjacent columns may constitute a column group. In more detail, the column group may include the heating electrodes 130 which are disposed on both sidewalls of the mold pattern 123 to constitute the pair of adjacent columns. The heating electrodes 130 in one of the pair of columns constituting the column group and the heating electrodes 130 in the other of the pair of columns may be symmetrical with respect to a straight line between the pair of columns.

Filing dielectric patterns 139 may be disposed on the first interlayer dielectric layer 110. Each of the filling dielectric patterns 139 may be provided between the pair of mold patterns 123 which are adjacent to each other in the first direction. In other words, each of the filling dielectric patterns 139 may be disposed between the pair of adjacent column groups including the heating electrodes 130. The filling dielectric patterns 139 may extend in the second direction.

The mold patterns 123 and the filling dielectric patterns 139 may be located at the same level as the heating electrodes 130. The mold patterns 123 and the filling dielectric pattern 139 may include a silicon oxide material, a silicon nitride material and/or a silicon oxynitride material.

Mold spacers 137a may be disposed on the plate portions 133P of the heating electrodes 130. That is, the mold spacers 137a may be disposed between the heating electrodes 130 and the filling dielectric patterns 139. In each of the heating electrodes 130, a bottom surface of the mold spacer 137a may completely cover an entire top surface of the plate portion 133P. Thus, the mold patterns 137a may completely overlap with the top surfaces of the plate portions 133P, respectively, in a plan view. Uppermost ends of the mold spacers 137a may be located at the same level as the top surfaces of the second portions 133U of the heating electrodes 130. In an embodiment, one sidewall of the mold spacer 137a may completely cover one sidewall of the first portion 133L of the heating electrode 130 and one sidewall of the second portion 133U of the heating electrode 130 which are vertically aligned with each other. The mold spacers 137a may include a silicon oxide material, a silicon nitride material and/or a silicon oxynitride material.

First capping patterns 125 may be disposed between the mold patterns 123 and the heating electrodes 130. Further, second capping patterns 135a may be disposed between the mold spacers 137a and the heating electrodes 130. Each of the second capping patterns 135a may cover a top surface of the plate portion 133P of the heating electrode 130 and one sidewall of the heating electrode 130 extending from one side edge of the top surface of the plate portion 133P in the third direction. In an embodiment, the second capping pattern 135a may contact one sidewall and a bottom surface of the mold spacer 137a. The first capping patterns 125 and the second capping patterns 135a may include an insulating nitride material. For example, the first capping patterns 125 and the second capping patterns 135a may include a silicon nitride material. The first capping patterns 125 and the second capping patterns 135a may prevent conductive elements in the heating electrodes 130 from being out-diffused into the other components adjacent thereto.

A pair of sidewall spacers 165 may be disposed on the first portion 133L of each heating electrode 130. The pair of sidewall spacers 165 may be disposed at either side of the second portion 133U of each of the heating electrodes 130. In an embodiment, uppermost ends of the sidewall spacers 165 may be coplanar with the top surfaces of the second portions 133U of the heating electrodes 130. In an embodiment, the sidewall spacers 165 may be located at substantially the same level as the second portions 133U of the heating electrodes 130.

The top surface of each of the first portions 133L may include a pair of edges which are separated from each other by the second portion 133U. Width of one of the pair of edges of the first portion 133L along the second direction may be substantially equal to a lower width of the sidewall spacers 165 along the second direction. Thus, the separated edges of the first portions 133L may be completely covered with the sidewall spacers 165, respectively.

Variable resistive patterns 180 may be disposed on the corresponding heating electrodes 130. The variable resistive patterns 180 may be disposed in trenches 173 that penetrate a mask pattern 145a and a second interlayer dielectric layer 170 stacked over the substrate 100 to expose top surfaces of the second portions 133U of the heating electrodes 130. The variable resistive patterns 180 may contact the top surfaces of the second portions 133U of the heating electrodes 130. Each of the variable resistive patterns 180 may have a line shape extending in the second direction. The heating electrodes 130 constituting each of the columns may be connected to any one of the variable resistive patterns 180. Since the heating electrodes 130 may be arrayed in the plurality of columns on the first interlayer dielectric layer 110, the plurality of variable resistive patterns 180 may be disposed in parallel in the second interlayer dielectric layer 170.

Each of the variable resistive patterns 180 may include a phase change material. The phase change material in the variable resistive patterns 180 may include at least one of chalcogenide elements, for example, tellurium (Te) and selenium (Se). The phase change material may be formed to further include at least one of germanium (Ge), stibium (Sb), bismuth (Bi), lead (Pb), tin (Sn), silver (Ag), arsenic (As), sulfur (S), silicon (Si), phosphorus (P), oxygen (O) and nitrogen (N). For example, each of the variable resistive patterns 180 may include at least one of a Ge—Sb—Te compound material, an As—Sb—Te compound material, an As—Ge—Sb—Te compound material, a Sn—Sb—Te compound material, a Ag—In—Sb—Te compound material, a In—Sb—Te compound material, a 5A group element —Sb—Te compound material, a 6A group element —Sb—Te compound material, a 5A group element —Sb—Se compound material and a 6A group element —Sb—Se compound material.

A capping electrode 193 and an interconnection line 195 may be disposed on each of the variable resistive patterns 180. The capping electrode 193 and the interconnection line 195 sequentially stacked may constitute an upper electrode. The capping electrode 193 and the interconnection line 195 may have a line shape extending in the second direction. The capping electrode 193 and the interconnection line 195 may be sequentially stacked on each of the variable resistive patterns 180. The capping electrode 193 may include a metal layer and a metal compound layer. For example, the capping electrode 193 may include any one selected from the group consisting of a titanium (Ti) layer, a titanium silicide (TiSi$_x$) layer, a titanium nitride (TiN) layer, a titanium oxynitride (TiON) layer, a TiW layer, a TiAlN layer, a TiAlON layer, a TiSiN layer, a TiBN layer, a tungsten (W) layer, a tungsten silicide (WSi$_x$) layer, a tungsten nitride (WN) layer, a tungsten oxynitride (WON) layer, a WSiN layer, a WBN layer, a WCN layer, a tantalum (Ta) layer, a tantalum silicide (TaSi$_x$) layer, a tantalum nitride (TaN) layer, a tantalum oxynitride (TaON) layer, a TaAlN layer, a TaSiN layer, a TaCN layer, a molybdenum (Mo) layer, a molybdenum nitride (MoN) layer, a MoSiN layer, a MoAlN layrer, a niobium nitride (NbN) layer, a ZrSiN layer, a ZrAlN layer, a ruthenium (Ru) layer, a cobalt silicide (CoSi) layer, a nickel silicide (NiSi) layer, a conductive carbon group, a copper (Cu) layer and a combination thereof. The interconnection line 195 may include a tungsten layer, an aluminum layer or a copper layer.

In an embodiment, although not shown in the drawings, contact plugs may be disposed between the variable resistive pattern 180 and the capping electrode 193 as well as between the capping electrode 193 and the interconnection line 195. In this case, the variable resistive pattern 180, the capping electrode 193 and the interconnection line 195 may be electrically connected to each other through the plugs.

According to the embodiment described above, width of the first portion 133L along the second direction is different from a width of the second portion 133U along the second direction. The second direction width of the first portion 133L contacting the conductive pad 117 is greater than the second direction width of the second portion 133U contacting the variable resistive pattern 180. Thus, a first contact area where and the second portion 133U contacts the variable resistive pattern 180 may be reduced by controlling the width of the first and second directions. Meanwhile, a second contact area where the plate portion 133P contact the conductive pad 117 may be independently controlled and have enough area to secure a pre-determined low contact resistance. Consequently, a high reliable semiconductor device may be realized.

Figure 2A:
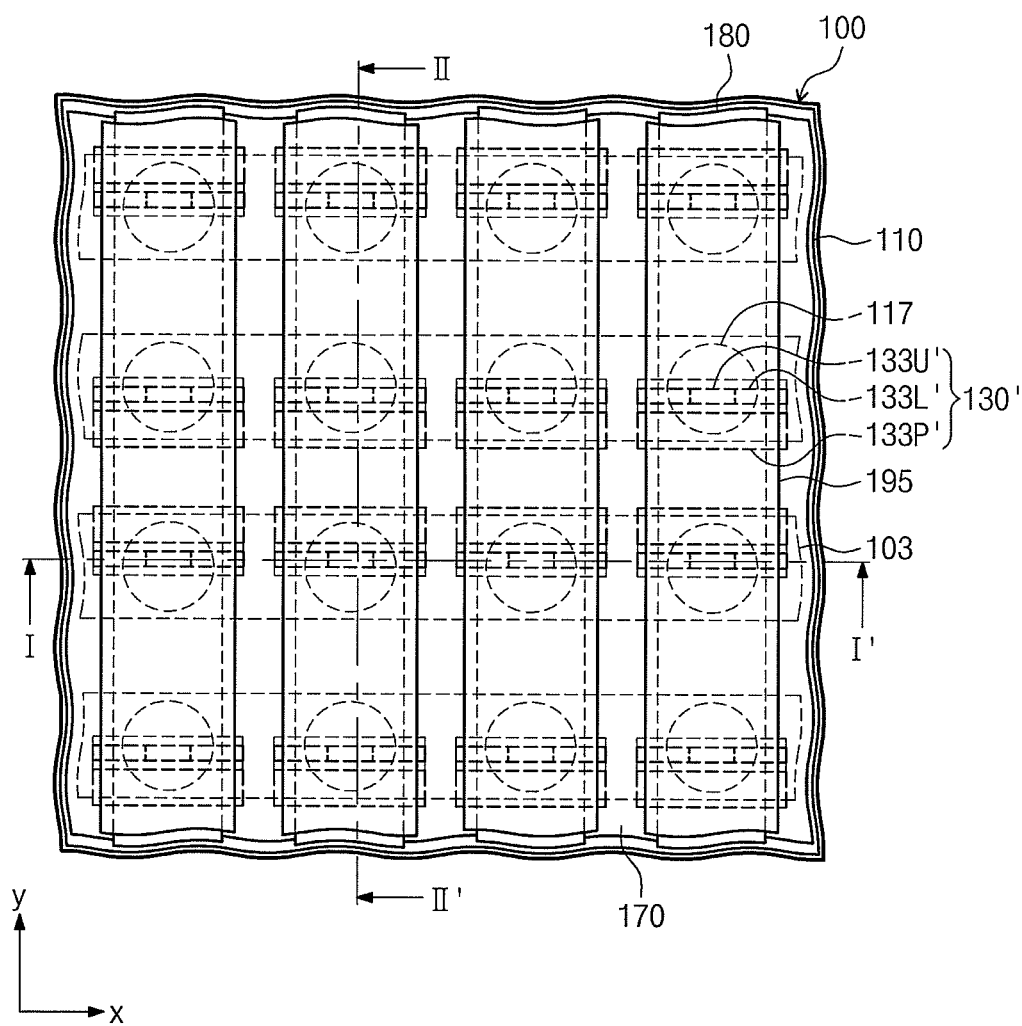

Another embodiment of the inventive concept will be described in FIGS. 2A to 2C. FIG. 2A is a plan views illustrating an embodiment of semiconductor memory devices according to embodiments of the inventive concept, and FIG. 2B is a merged cross sectional view taken along lines I-I' and II-II' of FIG. 2A to illustrate an embodiment of semiconductor memory devices according to embodiments of the inventive concept.

Figure 2B:
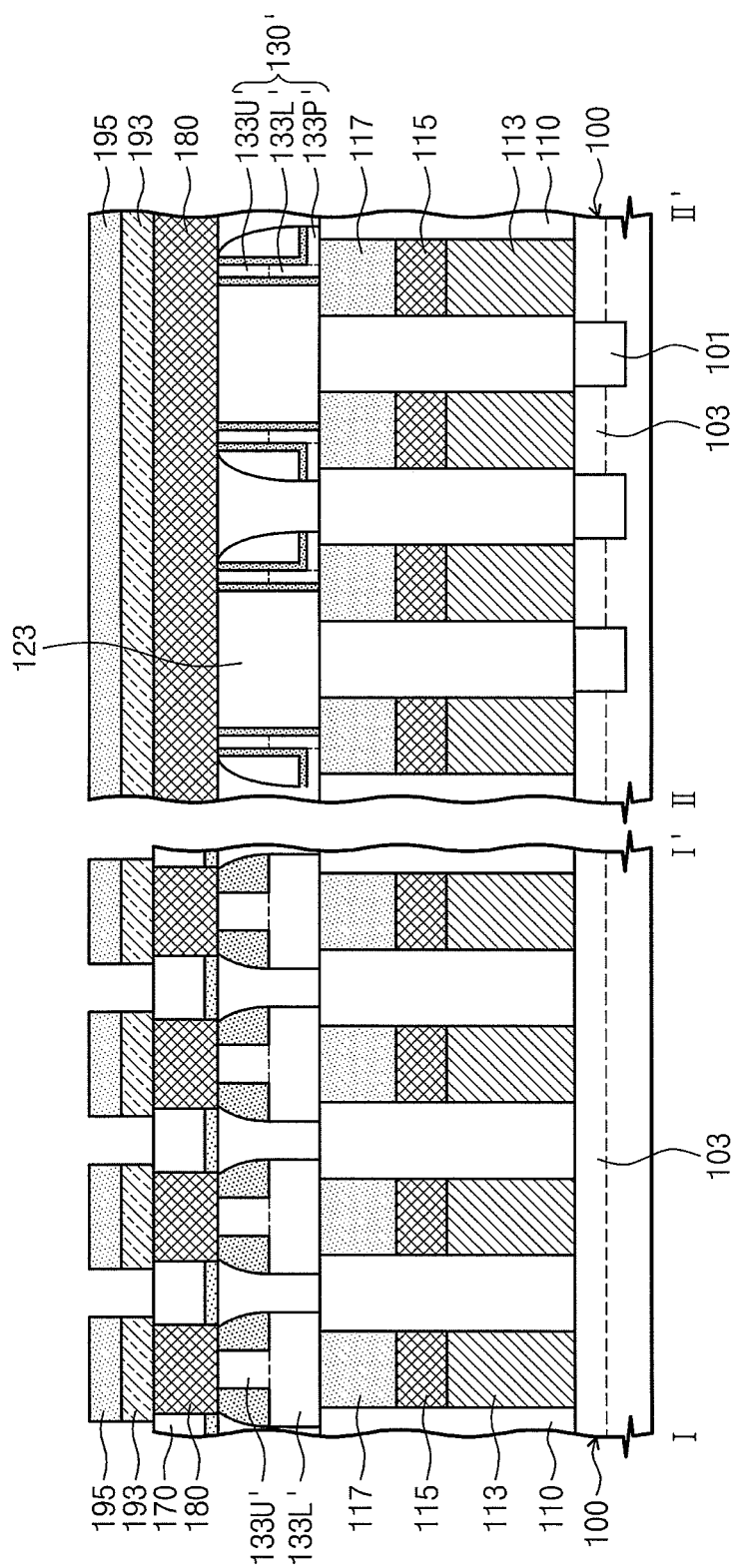

Referring to FIGS. 2A and 2B, a plurality of heating electrodes 130' may be disposed in rows and columns on the first interlayer dielectric layer 110. The heating electrodes 130' may have a similar shape to the heating electrodes 130 described in the previous embodiment. That is, each of the heating electrodes 130' may include a first portion 133L', a second portion 133U' and a plate portion 133P'. top surfaces of the first portions 133L' may have a rectangular shape extending in a direction perpendicular to a length direction of the variable resistive patterns 180 in a plan view. In more detail, the top surface of each the first portions 133L' may have a rectangular shape extending in a first direction, each of the variable resistive patterns 180 may be disposed to be parallel with a second direction. The first direction may correspond to a direction which is parallel with an X-axis, and the second direction may correspond to a direction which is parallel with a Y-axis. Further, the plate portions 133P' of the heating electrodes 130' may extend from lower ends of the first portions 133L' in the second direction, respectively.

The heating electrodes 130' arrayed in a pair of adjacent rows may belong to a row group. A mold pattern 123 may be disposed between the pair of adjacent rows. The mold pattern 123 may have a line shape extending in the first direction. A filling dielectric pattern 139 may be disposed between the pair of adjacent row groups.

The present embodiment may exhibit the same effects as the embodiment described with reference to FIGS. 1A and 1B. In addition, the semiconductor memory device according to the present embodiment may exhibit improved program (or writing) characteristics.

Meanwhile, a semiconductor device according to an embodiment of the inventive concept may include variable resistive patterns having a different shape from the variable resistive patterns illustrated in the above embodiments. For example, in the embodiment illustrated in FIGS. 1A, 1B and 1C, the variable resistive patterns 180 may have a line shape extending in the second direction. Alternatively, the variable resistive patterns 180 may be embodied in different forms.

Figure 3A:
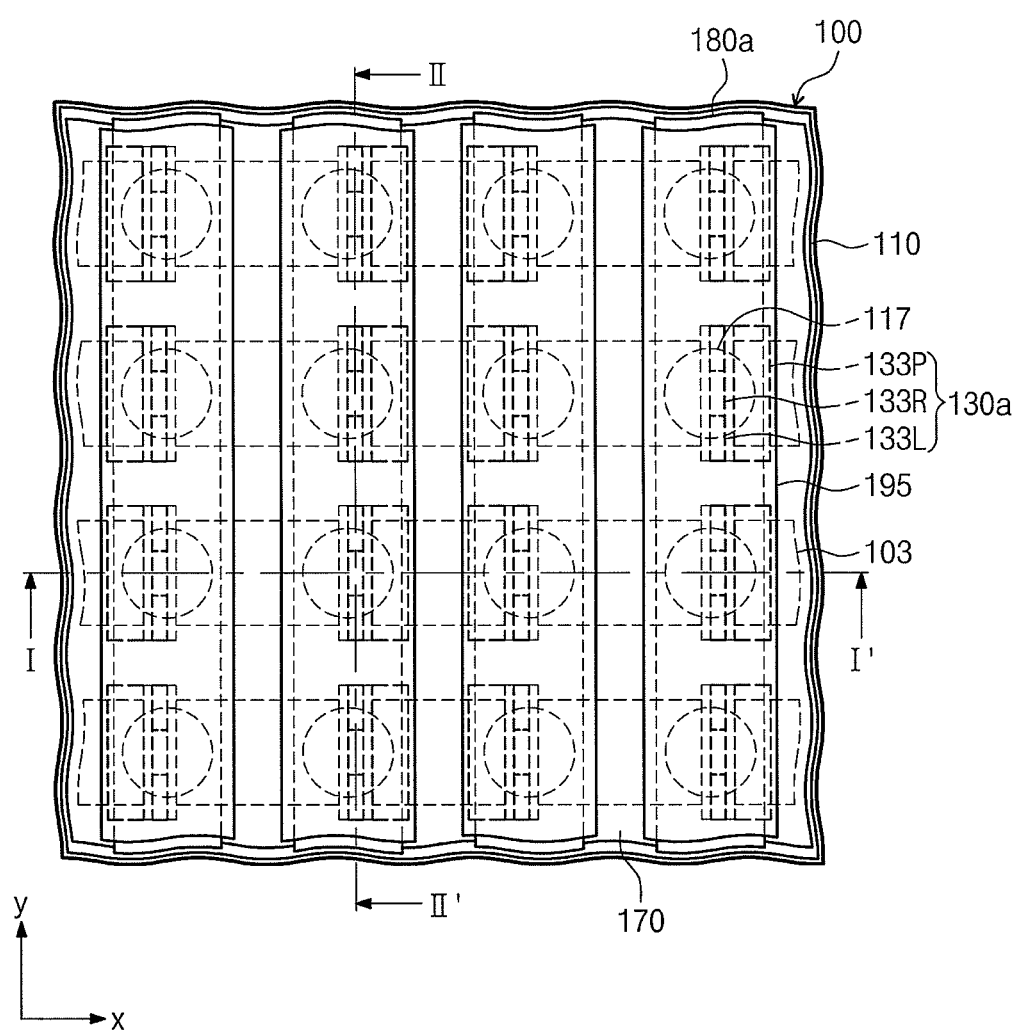
Figure 3B:
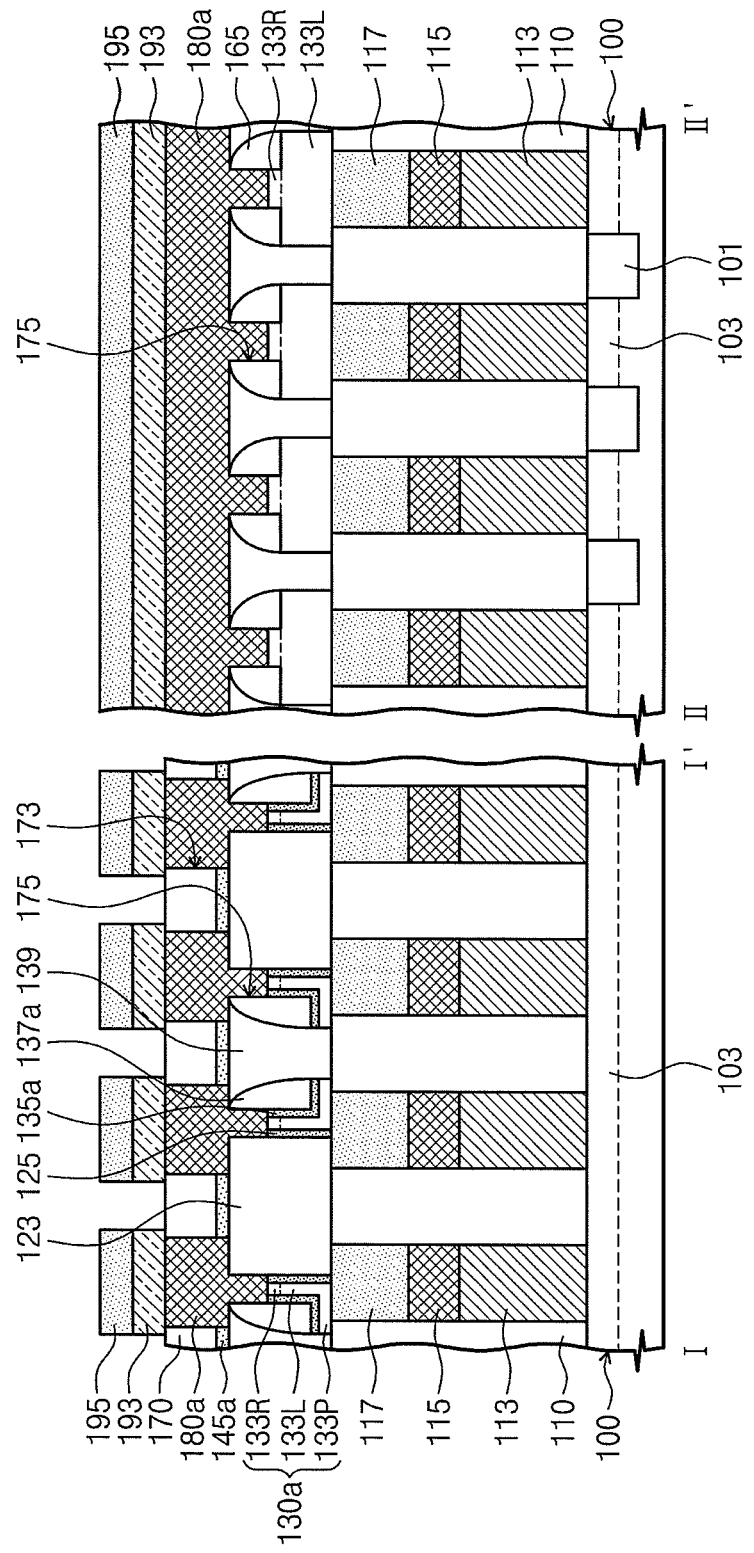

FIG. 3A is a plan views illustrating another embodiment of the variable resistive patterns in the semiconductor memory devices according to embodiments of the inventive concept, and FIG. 3B is a merged cross sectional view taken along lines I-I' and II-II' of FIG. 3A.

Referring to FIGS. 3A and 3B, a plurality of heating electrodes 130a may be disposed in rows and columns on the first interlayer dielectric layer 110. The heating electrodes 130 may have a similar shape to the heating electrodes 130 described in the previous embodiment. That is, each of the heating electrodes 130a may include a first portion 133L, a second portion 133R and a plate portion 133P. In the event that a top surface of the substrate 100 is employed as a reference surface, top surfaces of the second portions 133R may be located at a lower level than top surfaces of the mold patterns 123 and uppermost ends of the mold spacers 137a. Further, when the top surface of the substrate 100 is regarded as a reference surface, the top surfaces of the second portions 133R may be located at a lower level than uppermost ends of the sidewall spacers 165 disposed at both sides of each of the second portions 133R. That is, recessed regions 175 may be provided on the second portions 133R, respectively. Each of the recessed regions 175 may be defined by a top surface of the second portion 133R, the mold pattern 123, the mold spacer 137a and the pair of sidewall spacers 165.

The mask pattern 145a and the second interlayer dielectric layer 170 may be disposed on the mold patterns 123, the mold spacers 137a, the sidewall spacers 165 and the heating electrodes 130a. Trenches 173 may be disposed to penetrate the second interlayer dielectric layer 170 and the mask pattern 145a. The trenches 173 may be spatially connected to the recessed regions 175, respectively.

Variable resistive patterns 180a may be disposed in the recessed regions 175 and the trenches 173. The variable resistive patterns 180a may extend in the second direction to have a line shape. Each of the variable resistive patterns 180a may have a plurality of extensions protruding downwardly. The extensions of the variable resistive patterns 180a may correspond to portions that fill the recessed regions 175. Thus, each of the extensions of the variable resistive patterns 180a may be surrounded by the mold pattern 123, the mold spacer 137a and the pair of sidewall spacers 165. A second direction width of the extensions of the variable resistive patterns 180a may be substantially equal to a second direction width of the second portions 133R of the heating electrodes 130a. In an embodiment, the extensions of the variable resistive patterns 180a may contact the top surfaces of the second portions 133R of the heating electrodes 130a.

The heating electrodes 130a arrayed in one of the columns may be connected to one of the variable resistive patterns 180a. That is, each of the variable resistive patterns 180a may include the extensions contacting the heating electrodes 130a arrayed in one of the columns.

The variable resistive patterns 180a may include substantially the same material as the variable resistive patterns 180 described in the previous embodiment. That is, the variable resistive patterns 180a may include a phase change material. The capping electrode 193 and the interconnection line 195 may be sequentially stacked on each of the variable resistive patterns 180a.

The present embodiment may exhibit the same effects as the embodiment described with reference to FIGS. 1A and 1B. In addition, the variable resistive pattern 180a of the semiconductor memory device according to the present embodiment may include the extensions filling the recessed regions 175. Each of the recessed regions 175 is defined by a top surface of the second portion 133R, the mold pattern 123, the mold spacer 137a and the pair of sidewall spacers 165. Thus, the extensions of the variable resistive patterns 180a may be self-aligned with uppermost surfaces of the heating electrodes 130a. Consequently, the alignment margin between the variable resistive patterns 180a and the heating electrodes 130a can be improved.

Figure 4A:
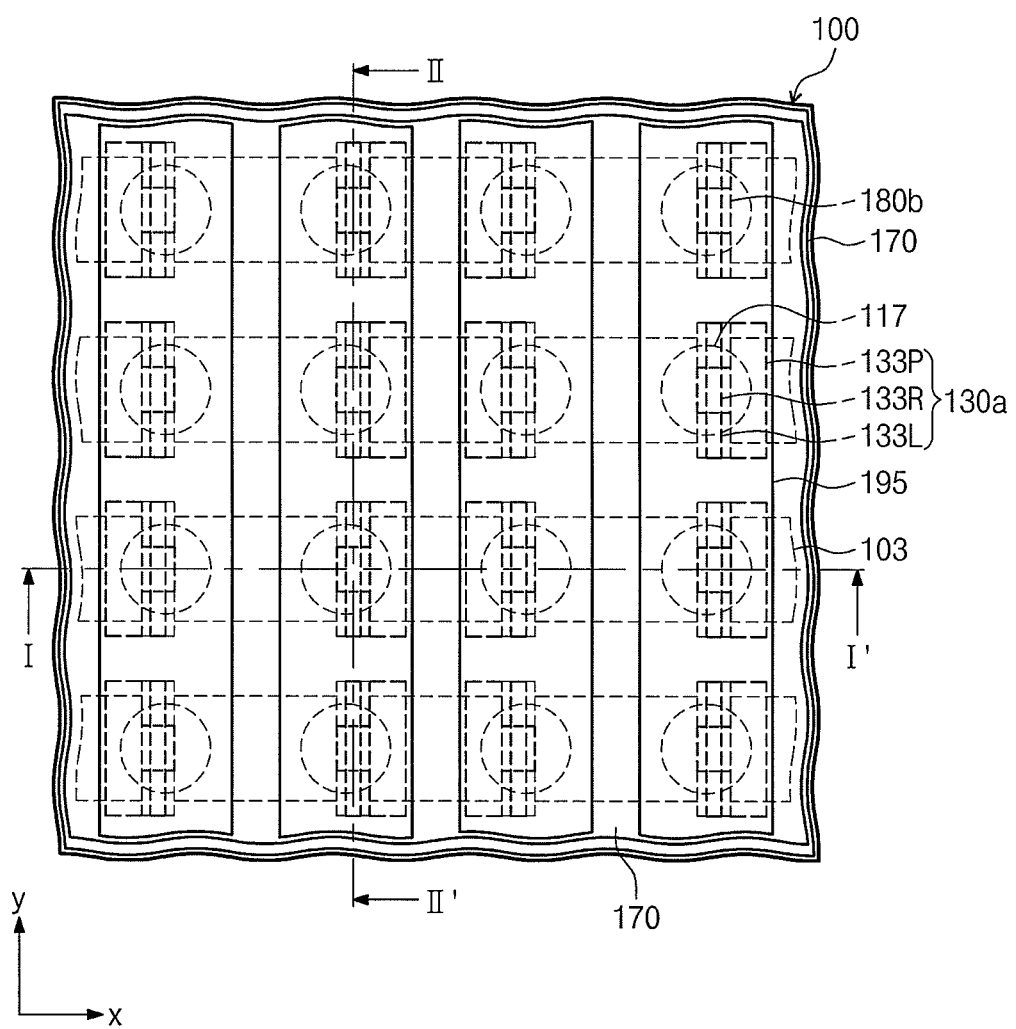
Figure 4B:
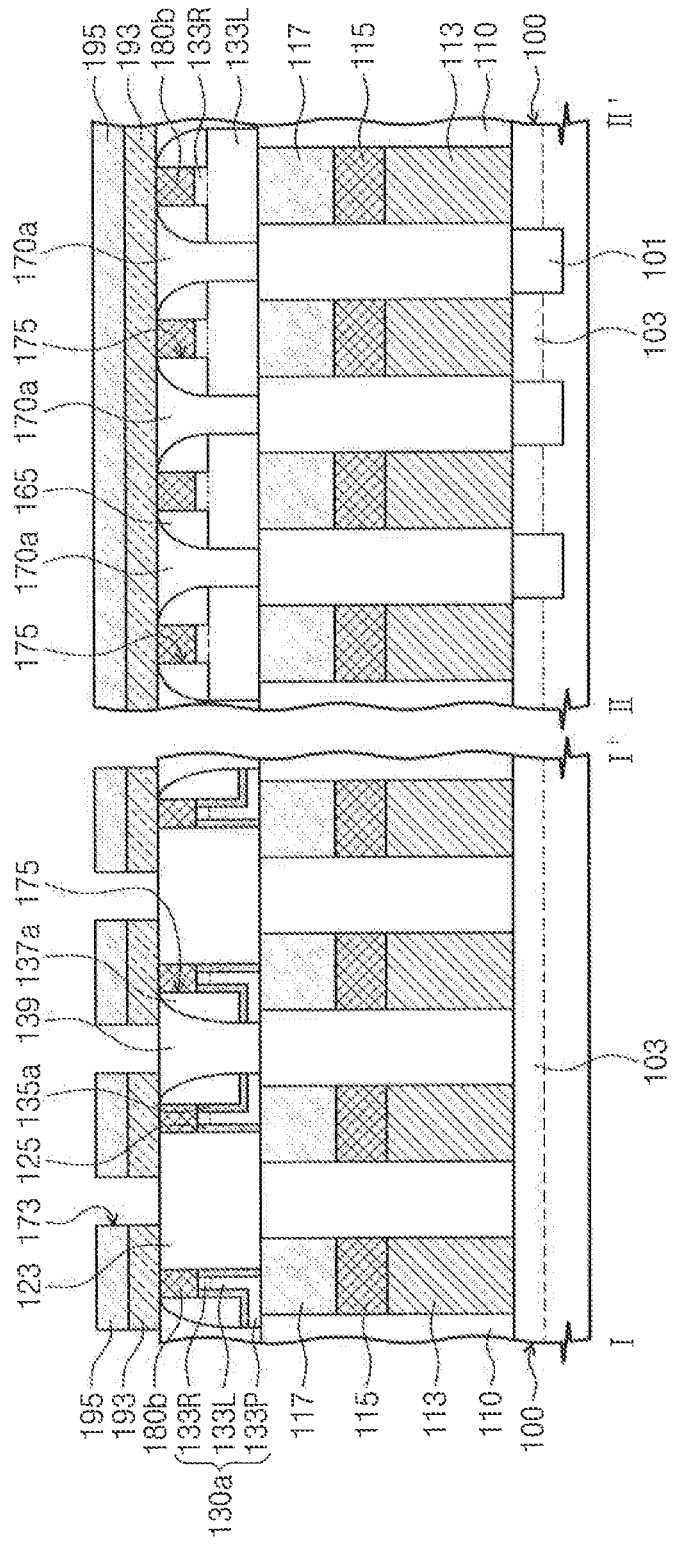

FIG. 4A is a plan view illustrating yet another embodiment of semiconductor memory devices according to embodiments of the inventive concept, and FIG. 4B is a merged cross sectional view taken along lines I-I' and II-II' of FIG. 4A.

Referring to FIGS. 4A and 4B, the heating electrodes 130a described with reference to FIGS. 3A and 3B may be disposed on the conductive pads 117, respectively. The number of the heating electrodes 130a may be two or more. The heating electrodes 130a may be arrayed to include substantially the same configurations as the heating electrodes 130 described with reference to FIGS. 1A and 1B.

The mold patterns 123, the filling dielectric patterns 139 and the mold spacers 137a may be disposed on the first interlayer dielectric layer 110. The mold patterns 123, the filling dielectric patterns 139 and the mold spacers 137a may have the same shapes and configurations as those described with reference to FIGS. 3A and 3B.

Further, the sidewall spacers 165 may be disposed at both sides of each of the second portions 133R. The sidewall spacers 165 may have the same shapes as those described with reference to FIGS. 3A and 3B.

The recessed regions 175 may be provided on the second portions 133R of the heating electrodes 130a, like the embodiment illustrated in FIGS. 3A and 3B. That is, each of the recessed regions 175 may be defined by a top surface of the second portion 133R, the mold pattern 123, the mold spacer 137a and the pair of sidewall spacers 165.

A plurality of variable resistive patterns 180b may be disposed in the recessed regions 175, respectively. That is, each of the variable resistive patterns 180b may be surrounded by the mold pattern 123, the mold spacer 137a and the pair of sidewall spacers 165. A second direction width of the variable resistive patterns 180b may be substantially equal to a second direction width of the second portions 133R of the heating electrodes 130a. Top surfaces of the variable resistive patterns 180b may be coplanar with top surfaces of the mold patterns 123 and the filling dielectric patterns 139. Further, the top surfaces of the variable resistive patterns 180b may be coplanar with uppermost ends of the mold spacers 137a and uppermost ends of the sidewall spacers 165. According to the present embodiment, the plurality of variable resistive patterns 180b may be provided over the substrate 100 and may be connected to the heating electrodes 130a respectively. That is, the variable resistive patterns 180b may be two dimensionally arrayed in rows and columns.

A capping electrode 193 and an interconnection line 195 may be sequentially stacked to cover the variable resistive patterns 180b arrayed in each of the columns.

The present embodiment may exhibit the same effects as the embodiment described with reference to FIGS. 3A and 3B.

Hereinafter, a method of forming a semiconductor memory device according to an embodiment of the inventive concept will be described with reference to FIGS. 5A to 15A and FIGS. 5B to 15B. FIGS. 5A to 15A are plan views of a layout structure for illustrating a method of forming a semiconductor memory device according to the inventive concept. FIGS. 5B to 8B are cross sectional views taken along lines I-I' of FIGS. 5A to 8A, respectively. FIGS. 9B to 15B are merged cross sectional views taken along lines I-I' and II-II' of FIGS. 9A to 15A, respectively.

Figure 5A:
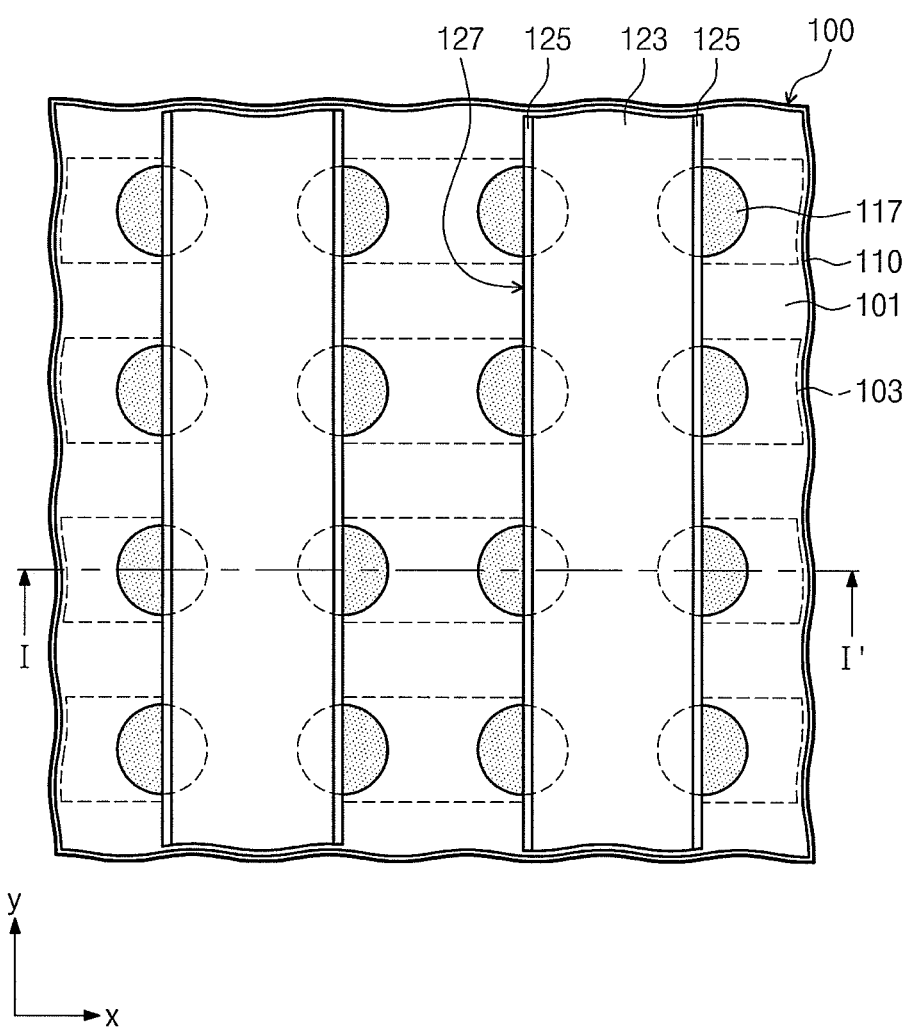
Figure 5B:
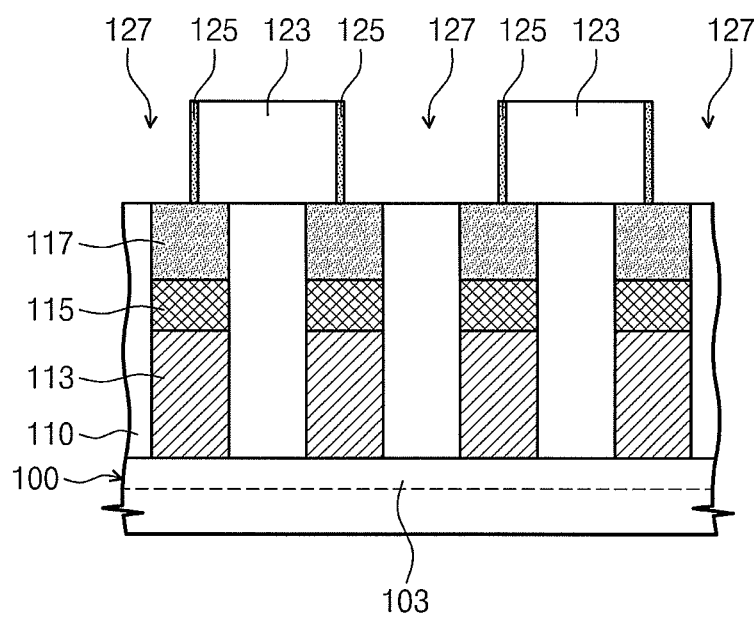

Referring to FIGS. 5A and 5B, an isolation pattern 101 may be formed in a substrate 100 to define active regions. The active regions may extend in a first direction. The first direction may be an X-axis of FIG. 5A. The active regions may be doped with dopants of a first conductivity type.

Word lines 103 may be formed in the corresponding active regions. The word lines 103 may be formed by doping an upper portion of the active regions with dopants of a second conductivity type. One of the first conductivity type and the second conductivity type may be a P-type, and the other one may be an N-type. In an embodiment, the active regions may be doped with P-type dopants, and the word lines 103 may be doped with N-type dopants.

A first interlayer dielectric layer 110 may be formed on the substrate. The first interlayer dielectric layer 110 may be an oxide layer, a nitride layer and/or an oxynitride layer.

One or more holes may be formed in the first interlayer dielectric layer 110, exposing portions of a top surface of the corresponding word lines 103. The holes may be two dimensionally arrayed along the first direction and along a second direction perpendicular to the first direction in a top plan view. The first direction may be an X-axis of FIG. 5A, and the second direction may be a Y-axis of FIG. 5A. The holes arrayed in the direction of X-axis may expose portions of one of the active regions and may be spaced apart from each other.

A selection element 113, an ohmic pattern 115 and a conductive pad 117 may be sequentially stacked in each of the holes.

The selection element 113 may be formed by forming a semiconductor pattern in each of the holes, injecting first conductivity type dopants into a lower portion of the semiconductor pattern, and injecting second conductivity type dopants into an upper portion of the semiconductor pattern. Top surfaces of the semiconductor patterns in the holes may be at a lower level than a top surface of the first interlayer dielectric layer 110. The semiconductor patterns may be a silicon layer, a germanium layer or a silicon-germanium layer. In an embodiment, the semiconductor patterns may include the same semiconductor material as the substrate 100. Injecting the first and second conductivity type dopants may be performed using an ion implantation process or an in-situ process.

The ohmic patterns 115 may be a metal silicide. A metal layer may be formed to contact the top surfaces of the selection elements 113. The metal layer reacts with the selection elements 113 through a silicidation process. The unreacted portion of the metal layer may be selectively removed, forming the ohmic patterns 115. The metal layer may be a nickel layer, a titanium layer and/or a cobalt layer. Top surfaces of the ohmic patterns 115 may be at a lower level than the top surface of the first interlayer dielectric layer 110.

The conductive pads 117 may be formed on the corresponding ohmic patterns 115. A conductive layer may be formed on the first interlayer dielectric layer 110, filling the holes. The conductive layer may be planarized until the top surface of the first interlayer dielectric layer 110 is exposed. The conductive layer that remains in the holes may be the conductive pads 117. The conductive layer may be formed using a chemical vapor deposition (CVD) process and/or a physical vapor deposition (PVD) process. The planarization may be performed by an etch-back process or a chemical mechanical polishing (CMP) process.

The conductive pads 117 formed in the holes may be arrayed in a two dimension in a top plan view. More specifically, the conductive pads 117 may be arrayed along a plurality of rows and along a plurality of columns. The rows may be parallel to the first direction, and the columns may be parallel to the second direction. The conductive pads 117 may be grouped as a plurality of column groups. The column groups may run parallel to the second direction. For example, a pair of adjacent conductive pads 117 columns may constitute one column group.

Mold patterns 123 may be formed on the first interlayer dielectric layer 110, extending in the second direction. Each of the mold patterns 123 may be formed on the first interlayer dielectric layer 110 disposed between a pair of adjacent columns constituting a single column group. Further, each of the mold patterns 123 may cover a portion of a top surface of each of the conductive pads 117 of the single column group.

A groove 127 may be defined between a pair of adjacent mold patterns 123. The groove 127 may expose a portion of the top surface of each of the conductive pads 117 and first interlayer dielectric layer 110 disposed between adjacent column groups. Consequently, the top surface of each conductive pad 117 may be divided into a first portion covered with the mold pattern 123 and a second portion exposed by the groove 127.

First capping patterns 125 may be formed on both sidewalls of each mold pattern 123. A first capping layer may be conformally formed on the mold patterns 123 and the exposed top surface of both the conductive pad 117 and the first interlayer dielectric layer 110. Then, the first capping layer may be anisotropically etched to expose top surfaces of the mold patterns 123. The first capping layer left on the sidewall of the mold pattern 123 may be first capping patterns 125. The first capping patterns 125 may include an insulating nitride material.

Figure 6A:
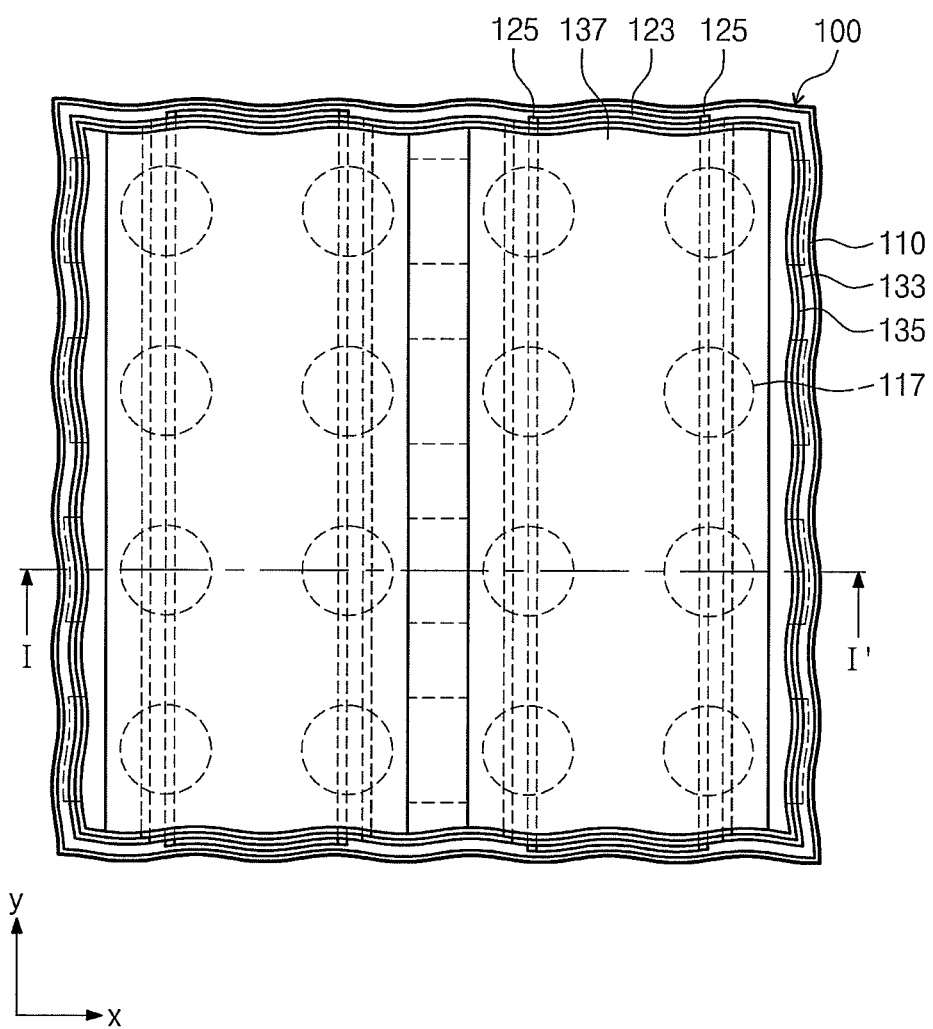
Figure 6B:
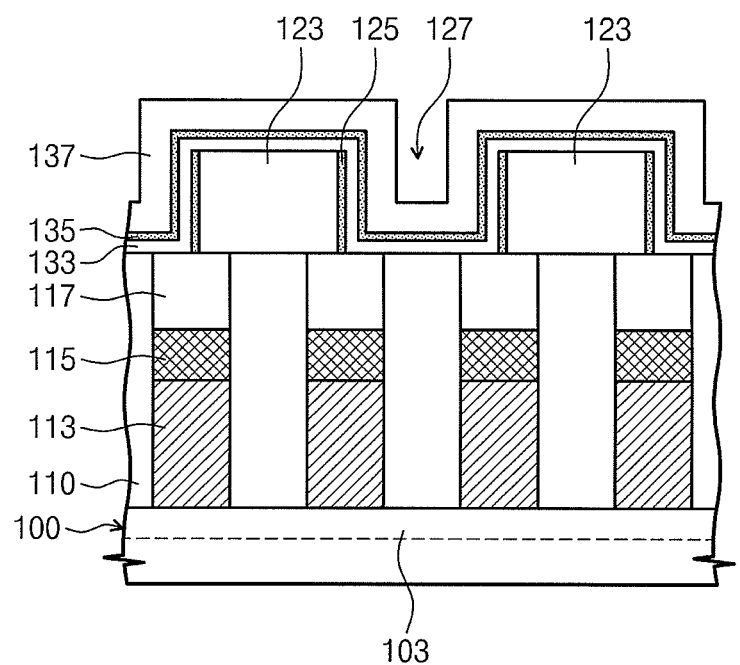

Referring to FIGS. 6A and 6B, a heating electrode layer 133, a second capping layer 135 and a mold spacer layer 137 may be sequentially formed on the mold patterns 123 having the first capping patterns 125, exposed top surfaces of both the conductive pad 117 and the first interlayer dielectric layer 110. The heating electrode layer 133 may be conformally formed on the top surfaces of the mold patterns 123 and on inner surfaces of the grooves 127. The second capping layer 135 may be conformally formed on the heating electrode layer 133.

Figure 7A:
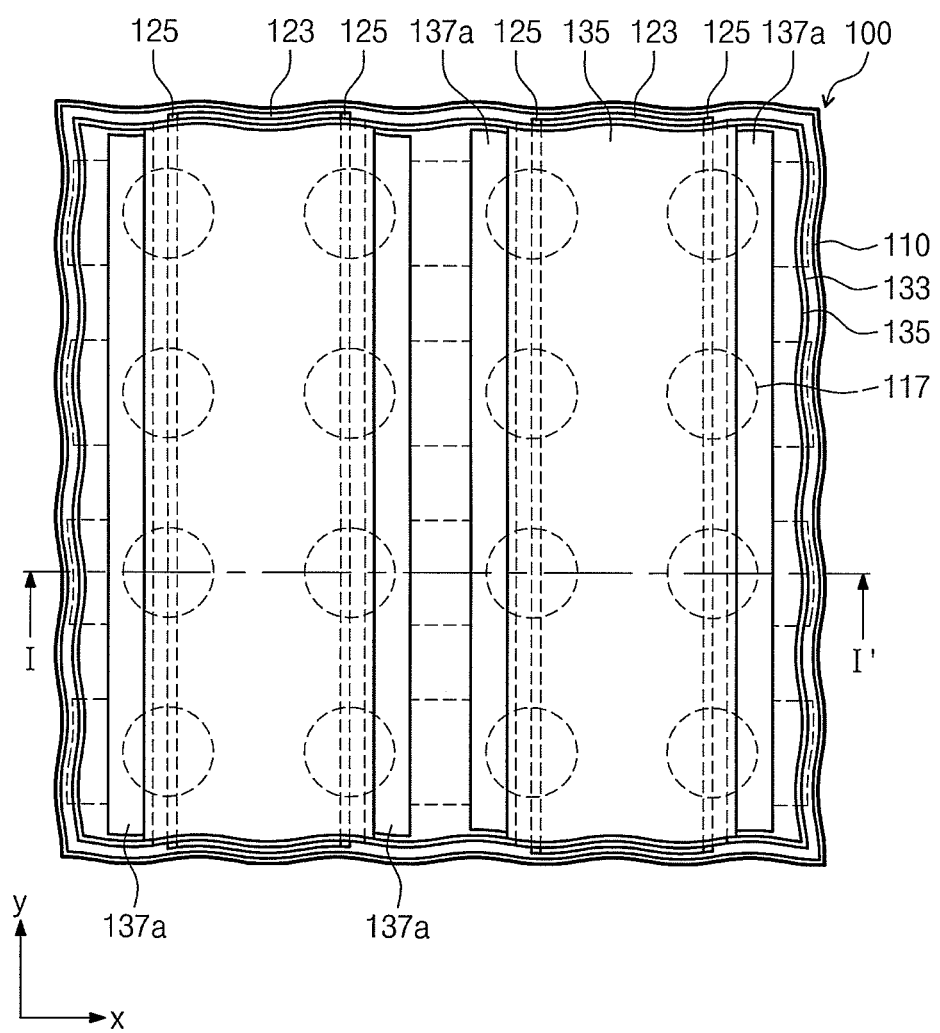
Figure 7B:
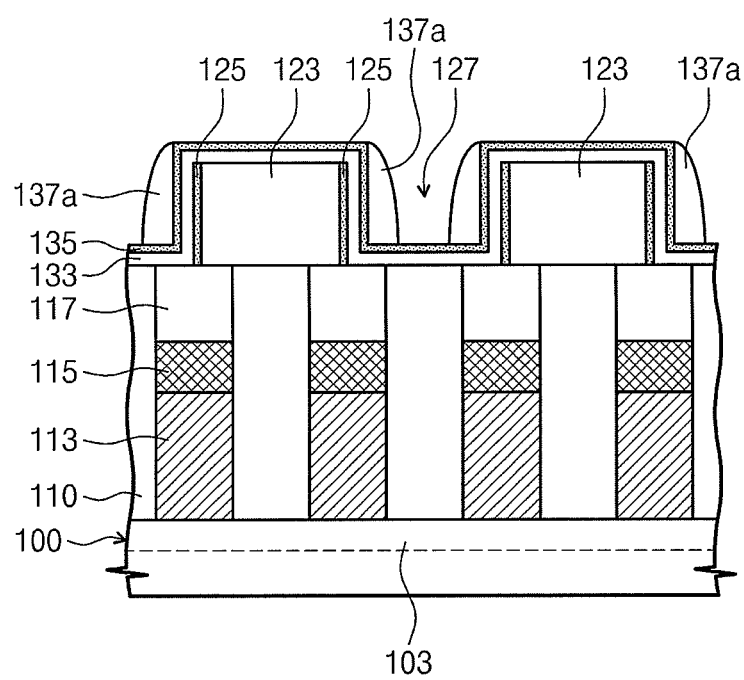

Referring to FIGS. 7A and 7B, mold spacers 137a may be formed from the mold spacer layer 137 of FIG. 7B. The mold spacer layer 137 may be anisotropically etched until the second capping layer 135 is exposed on the top surfaces of the mold patterns 123 and a portion of the second capping layer 135 on bottom surfaces of the grooves 127. The mold spacer layer 137 left on either sidewall of the mold patterns 123 may be the mold spacers 137a.

Figure 8A:
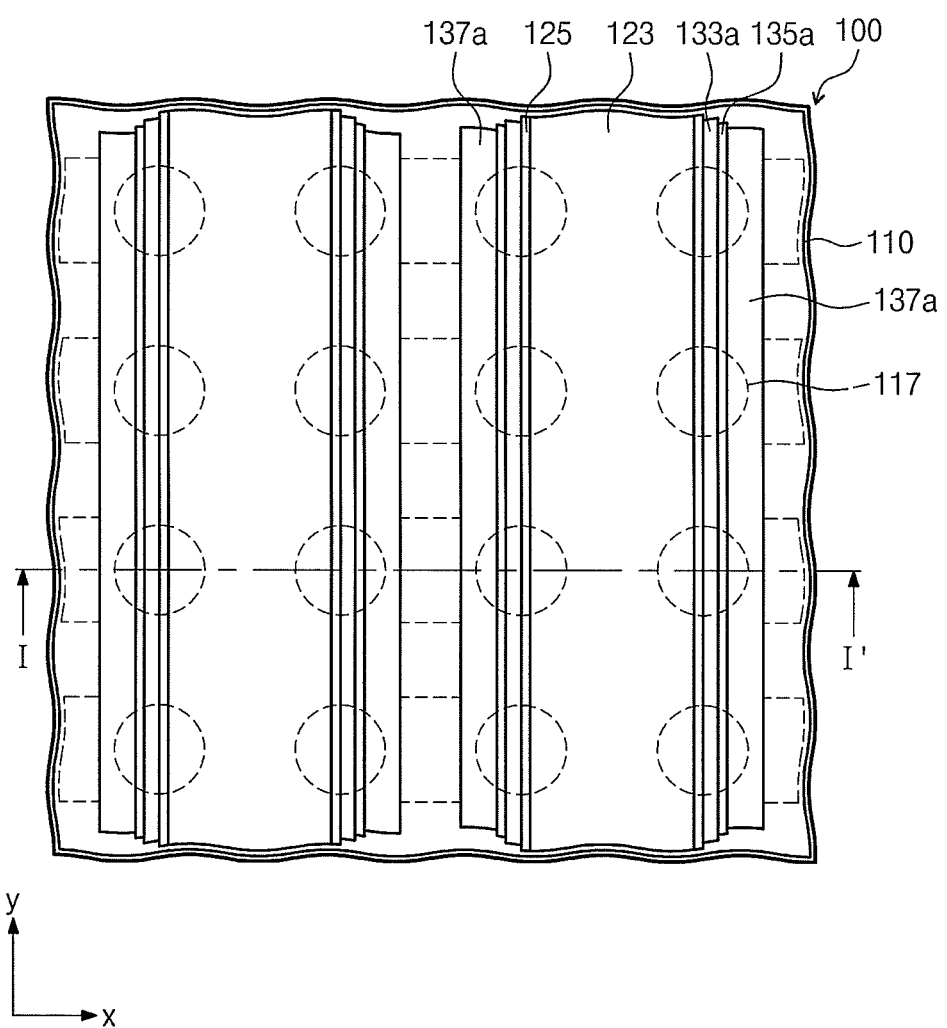
Figure 8B:
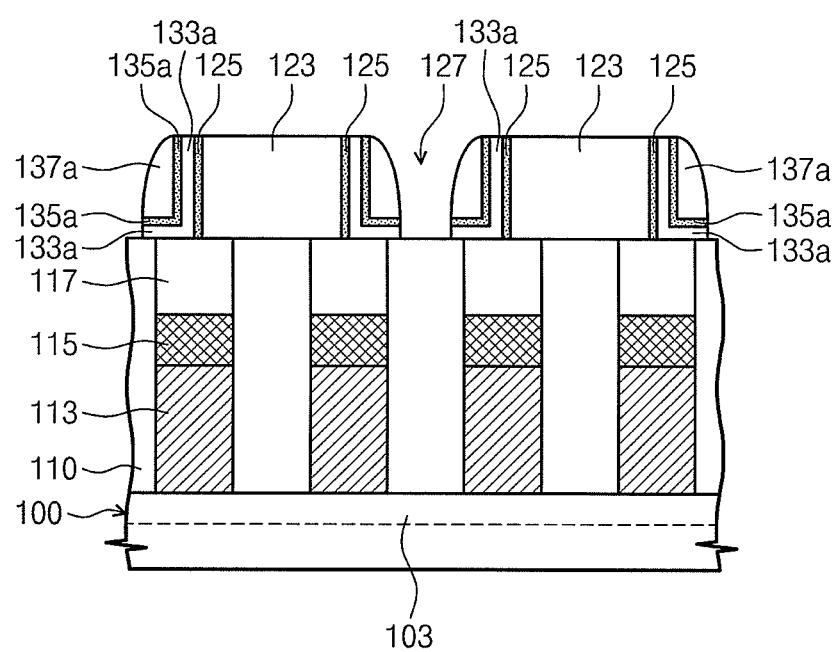

Referring to FIGS. 8A and 8B, heating electrode patterns 133a and second capping patterns 135a may be formed by further anisotropically etching the second capping layer 135 and the heating electrode layer 133. The second capping layer 135 and the heating electrode layer 133 may be etched away to expose the top surfaces of the mode patterns 123. Meanwhile, the mold spacers 137a may act as etch masks to expose portions of the top surface of the first interlayer dielectric layer 110 disposed between adjacent column groups.

The electrode patterns 133a and the second capping patterns 135a may be formed to extend in the second direction. Thus, each of the electrode patterns 133a may contact the corresponding conductive pads 117 and may be separated from each other.

Figure 9A:
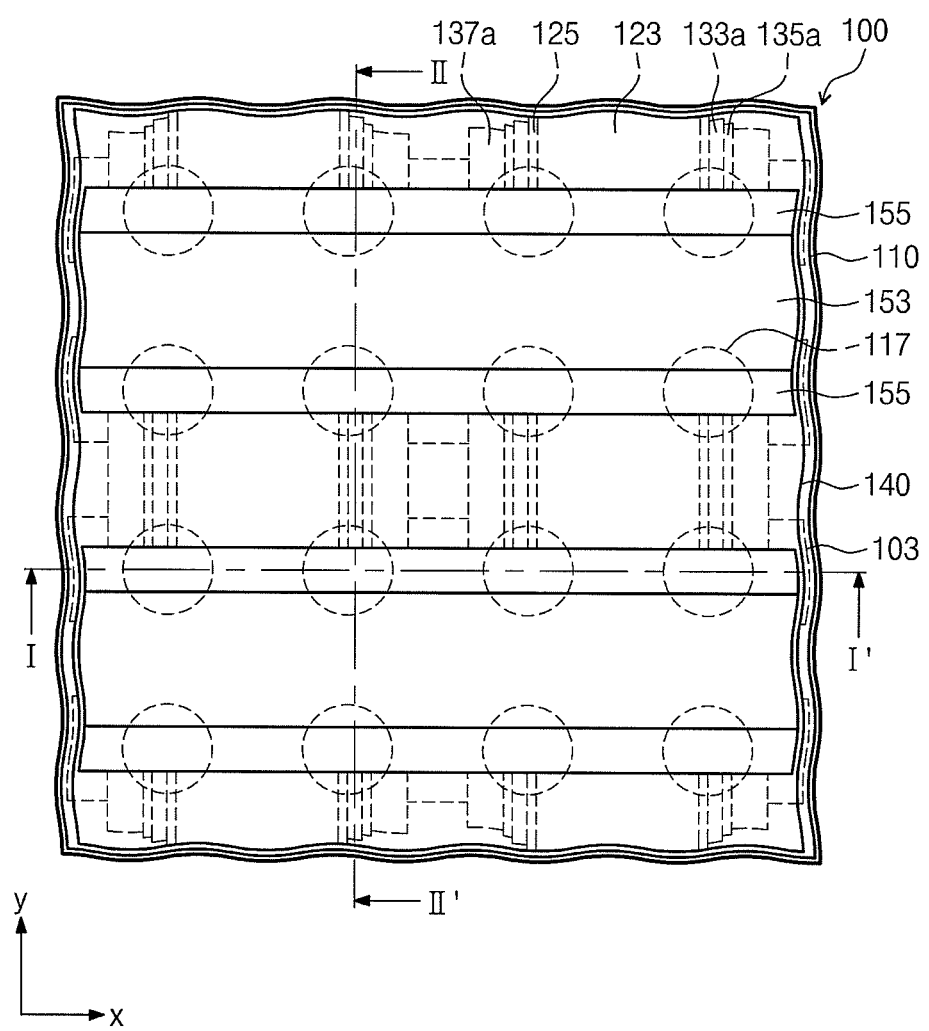
Figure 9B:
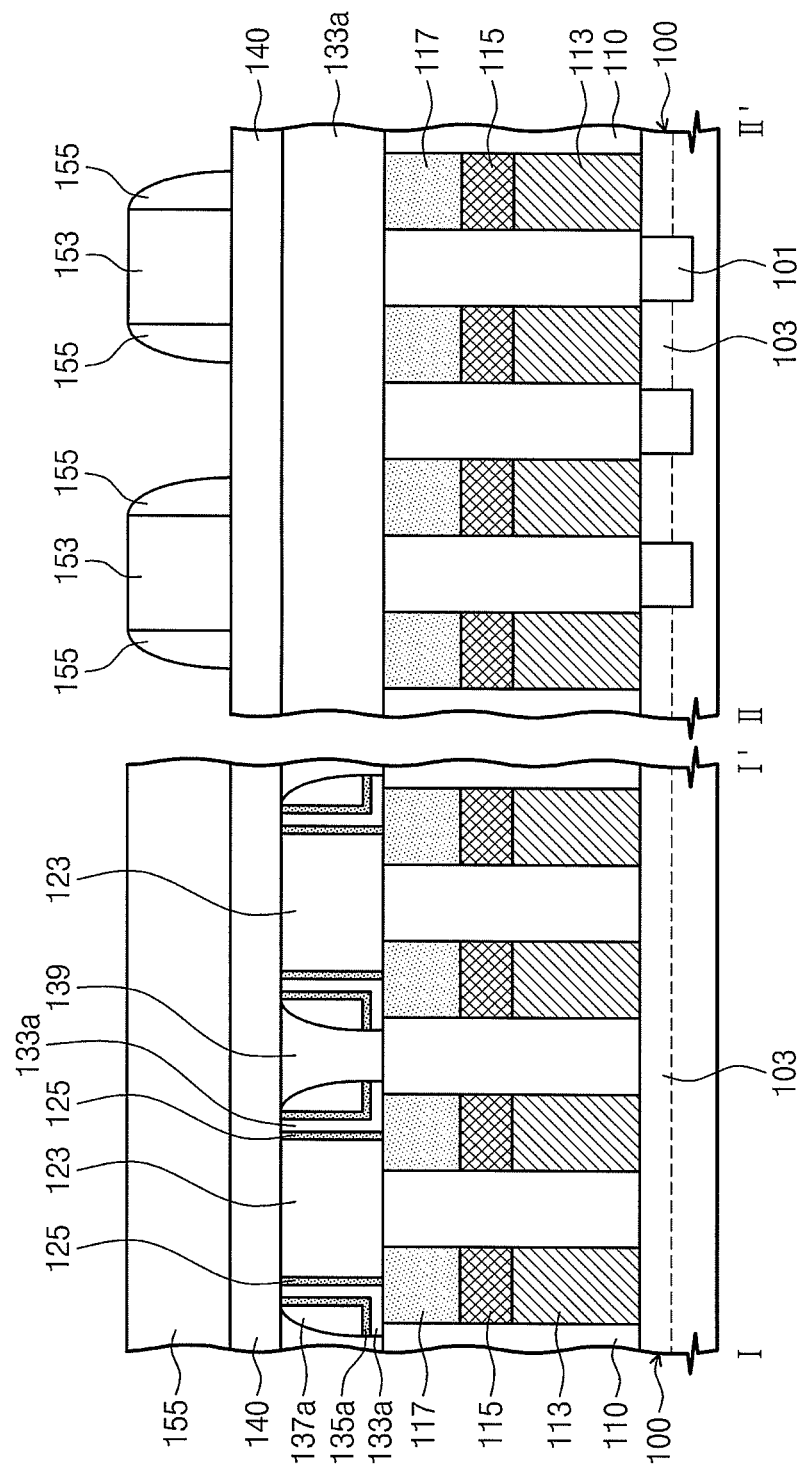

Referring to FIGS. 9A and 9B, filing dielectric patterns 139 may be formed in the grooves 127 surrounded by the mold spacers 137a. A filling dielectric layer may be formed on the entire surface of the resulting structure of FIG. 8B. Then, the filling dielectric layer may be planarized until top surfaces of the electrode patterns 133a are exposed. The filing dielectric layer left in the grooves 127 may be the filing dielectric patterns 139.

A mask layer 140 may be formed on the mold patterns 123 and the filing dielectric patterns 139. The mask layer 140 may be formed of a material having an etch selectivity with respect to the filing dielectric patterns 139 and the mold patterns 123. For example, in the event that the filing dielectric patterns 139 and the mold patterns 123 are formed of a silicon oxide layer, the mask layer 140 may be formed of a silicon nitride layer and/or a silicon oxynitride layer.

Sacrificial patterns 153 extending in the first direction may be formed on the mask layer 140. Mask spacers 155 extending in the first direction may be formed on either sidewall of the sacrificial patterns 153. Each of the sacrificial patterns 153 may be formed over the isolation pattern 101 between the pair of adjacent word lines 103. In an embodiment, each of the sacrificial patterns 153 may overlap with a portion of each of the conductive pads 117 arrayed in a pair of adjacent rows when viewed from a top plan view.

The sacrificial patterns 153, the mask spacers 155 and the mask layer 140 may be formed of different materials to have an etch selectivity with respect to each other. Further, the sacrificial patterns 153, the mask spacers 155 and the mask layer 140 may have an etch selectivity with respect to the mold spacers 137a and the filing dielectric patterns 139. For example, in the event that the mold spacers 137a and the filing dielectric patterns 139 include a silicon oxide layer, the mask layer 140 may include a silicon nitride material, the mask spacers 155 may include a polysilicon material, and the sacrificial patterns 153 may include a spin-on-hard mask (SOH) material and/or a photoresist material.

The mask spacers 155 may be formed by conformably forming a mask spacer layer on the mask layer 140 and the sacrificial patterns 153, and anisotropically etching the mask spacer layer until a top surface of the mask layer 140 and top surfaces of the sacrificial patterns 153 are exposed. Each of the mask spacers 155 may be formed over the conductive pads 117. Thus, each of the mask spacers 155 may overlap with at least a portion of each of the top surfaces of the conductive pads 117 when viewed from a top plan view.

Figure 10A:
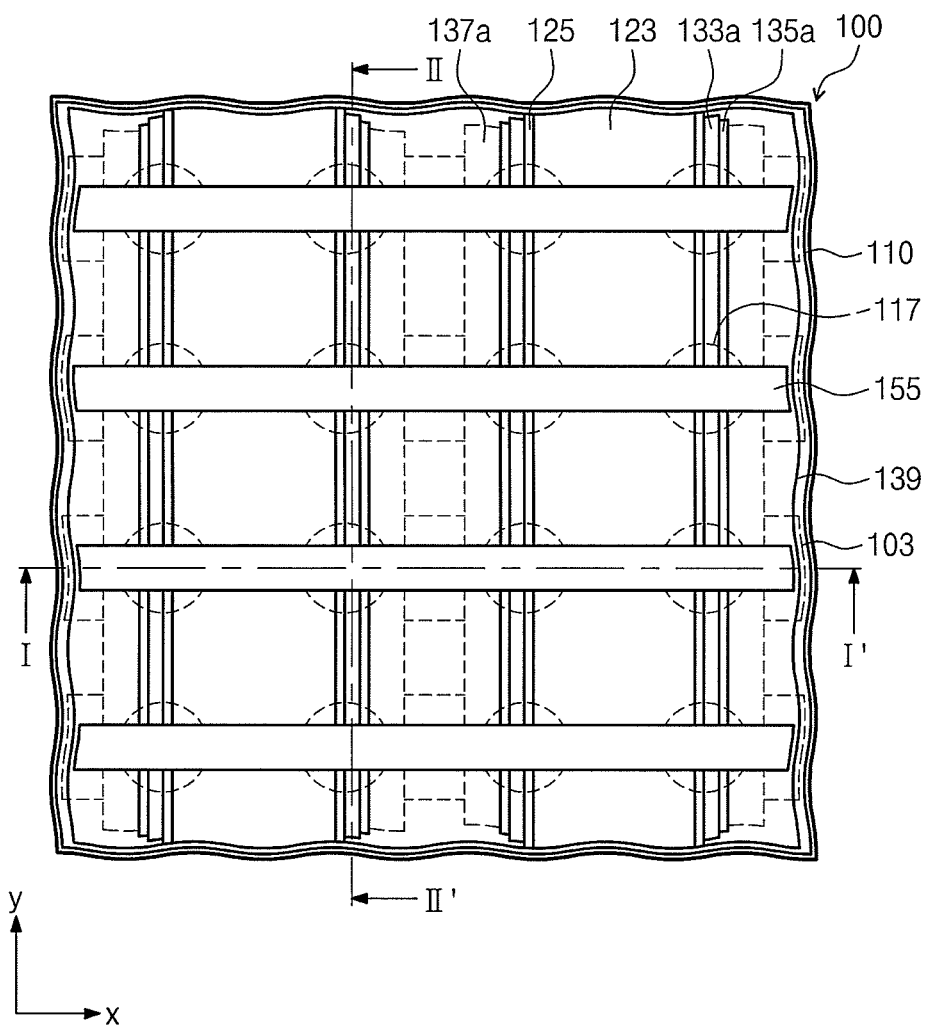
Figure 10B:
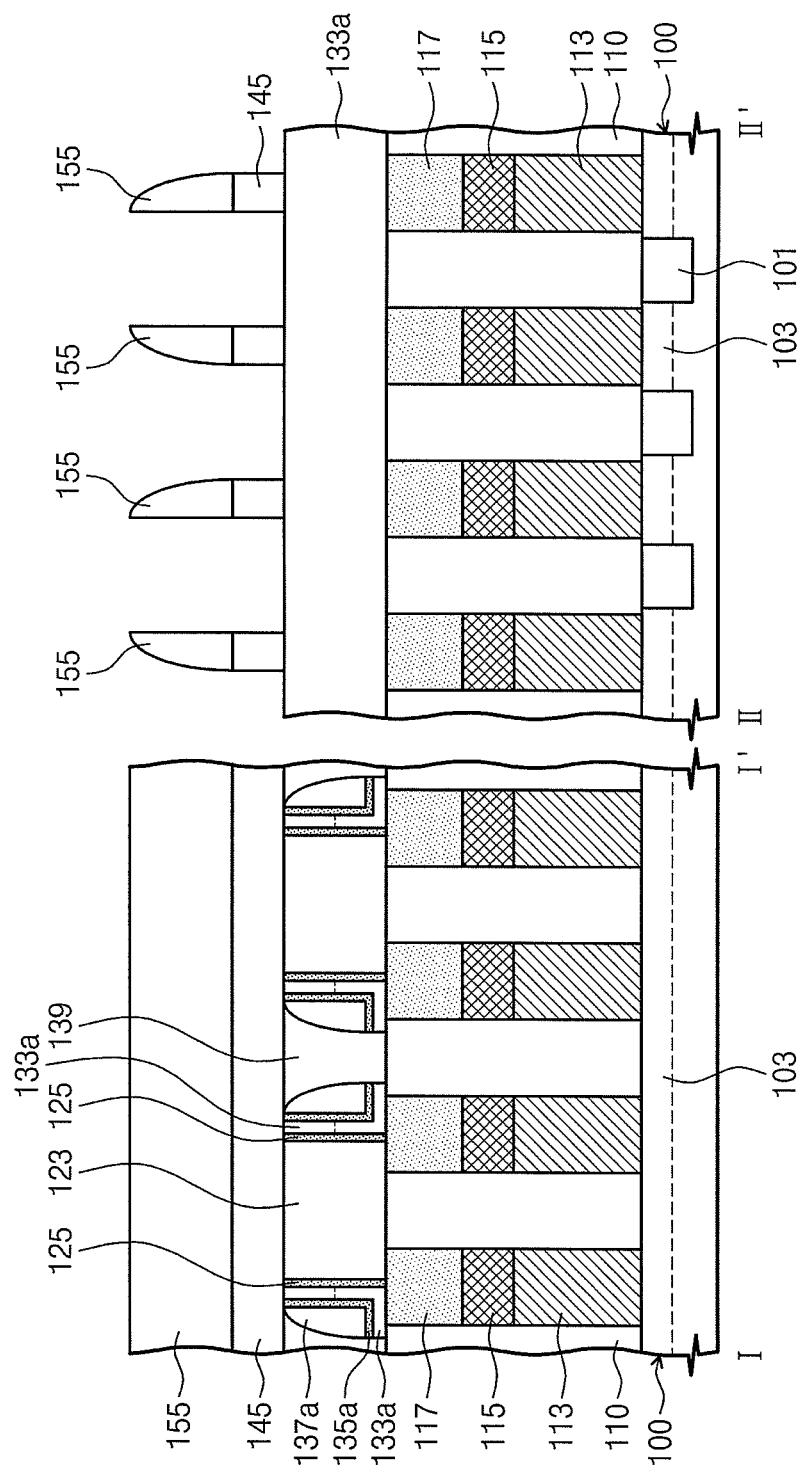

Referring to FIGS. 10A and 10B, the sacrificial patterns 153 may be removed. The sacrificial patterns 153 may be removed using a property that the sacrificial patterns 153 have an etch selectivity with respect to the mask spacers 155 and the mask layer 140. In an embodiment, the sacrificial patterns 153 may be removed using a wet etching process.

The mask layer 140 may be then etched using the mask spacers 155 as etch masks, thereby forming mask patterns 145. The mask patterns 145 may be formed to have a line shape extending in the first direction. Portions of each of the electrode patterns 133a may be exposed by the mask patterns 145.

Figure 11A:
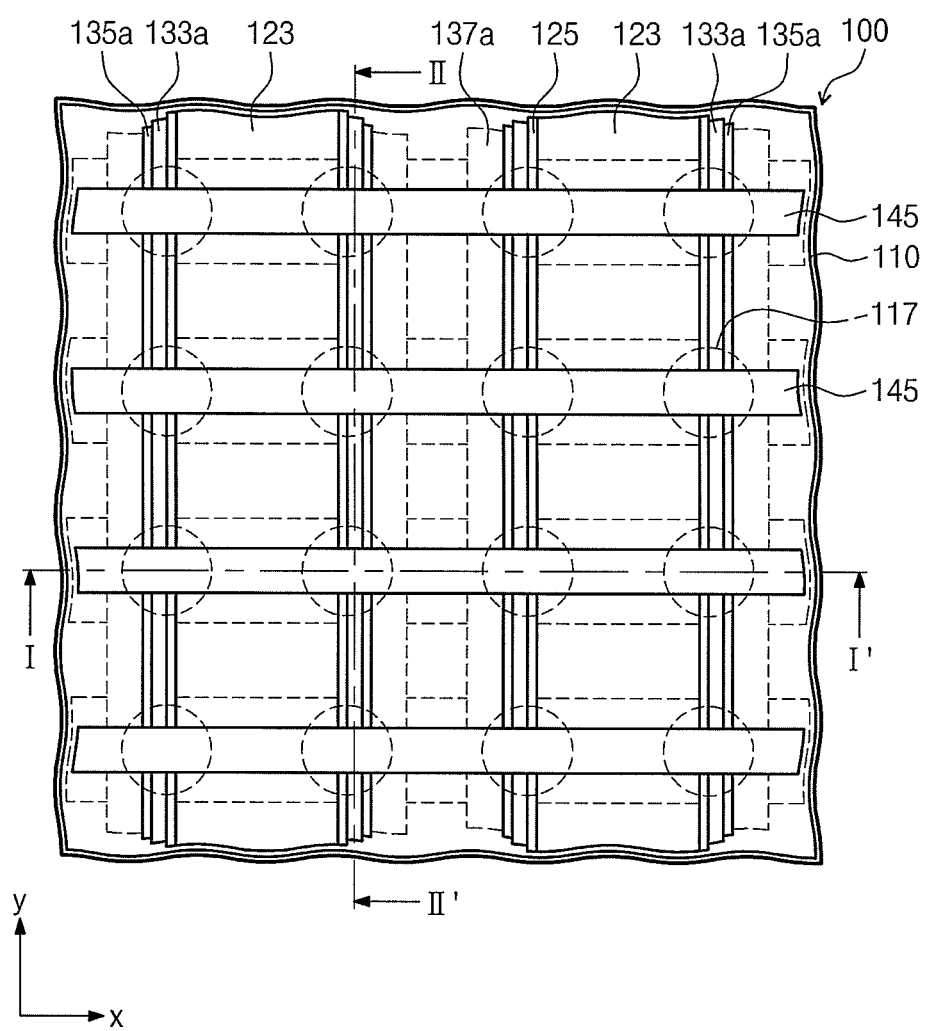

Referring to FIGS. 11A and 11B, the mask spacers 155 may be removed. Using the mask patterns 145 as etch masks, the electrode patterns 133a may be partially etched to form first recessed regions 132 in the electrode patterns 133a. While the electrode patterns 133a are partially etched, the first capping patterns 125 and the second capping patterns 135a may also be partially etched.

Figure 12A:
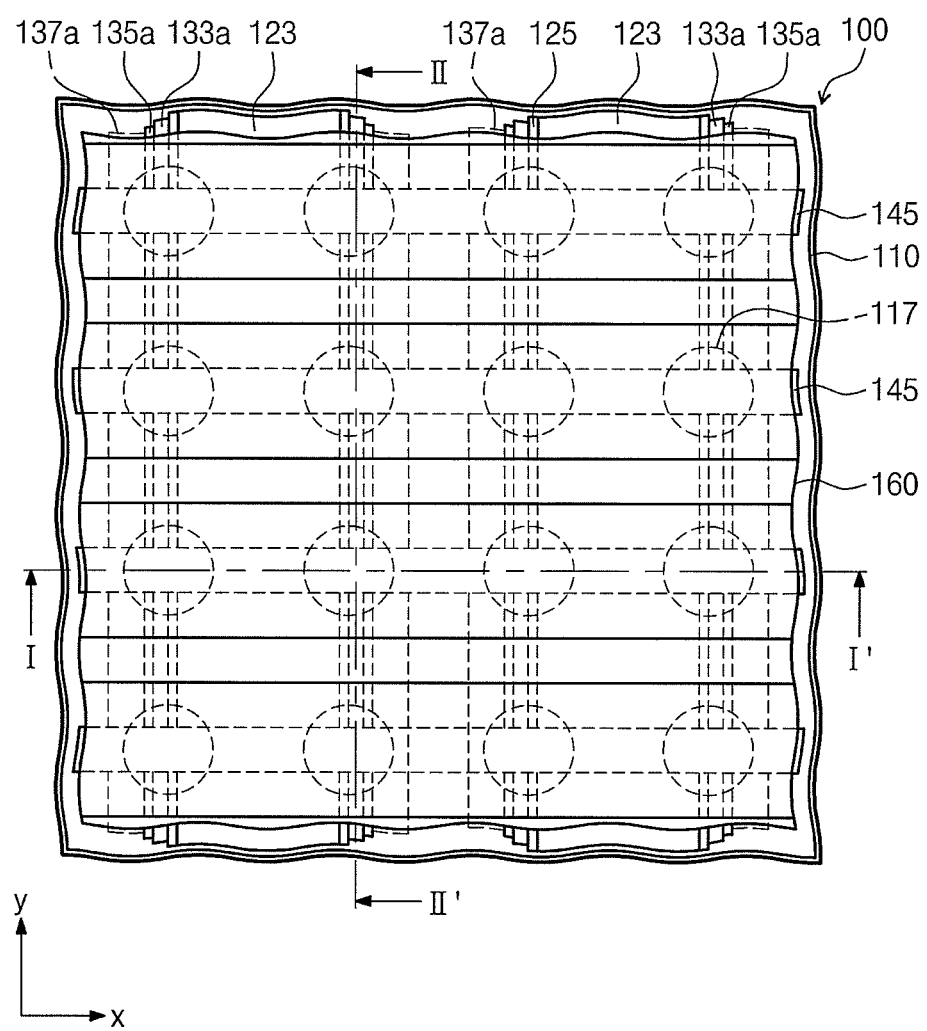
Figure 12B:
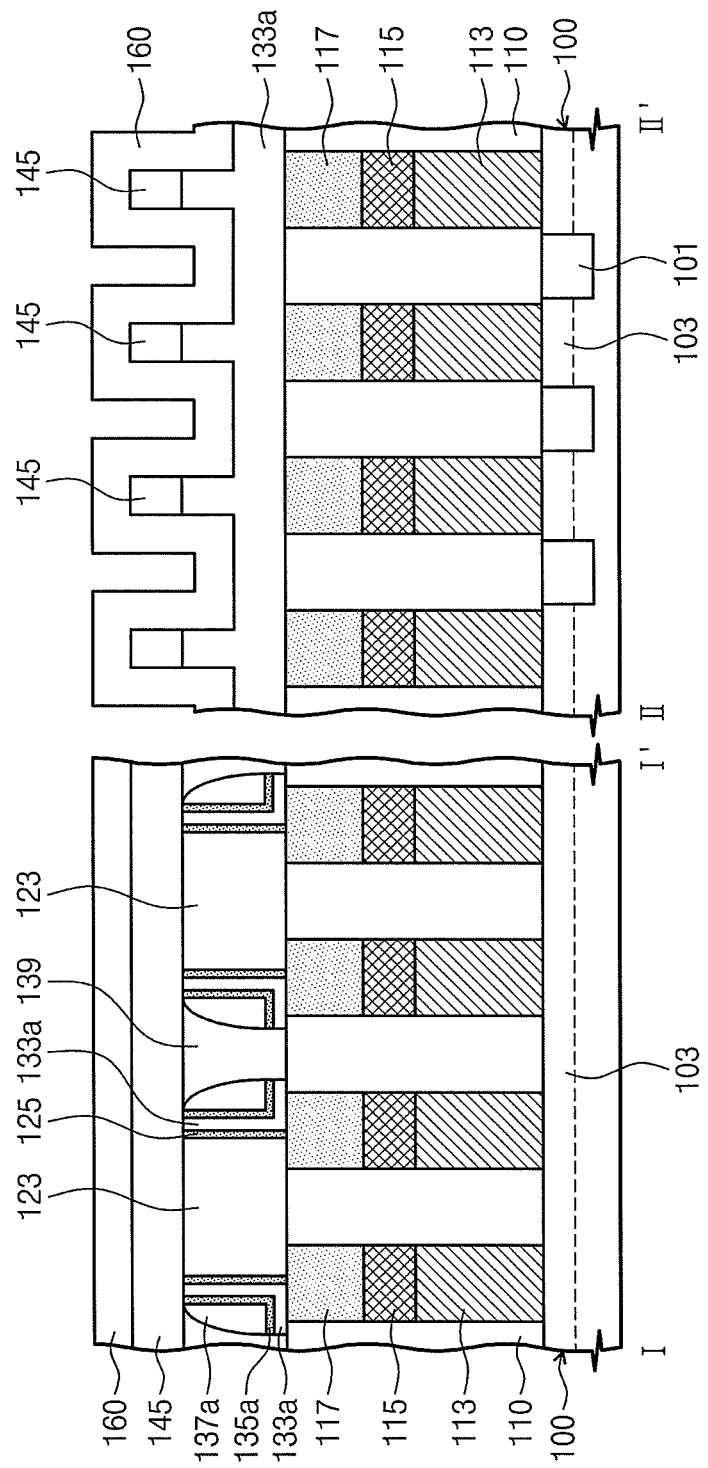

Referring to FIGS. 12A and 12B, a sidewall spacer layer 160 may be conformally formed on an entire surface of the resulting structure of FIG. 11B, where the first recessed regions 132 are formed. The sidewall spacer layer 160 may be formed to conformably cover inner surfaces of the first recessed regions 132. In an embodiment, the sidewall spacer layer 160 may be formed of the same material as the mask patterns 145. For example, in the event that the mask patterns 145 are formed of a silicon nitride material, the sidewall spacer layer 160 may include a silicon nitride material.

Figure 13A:
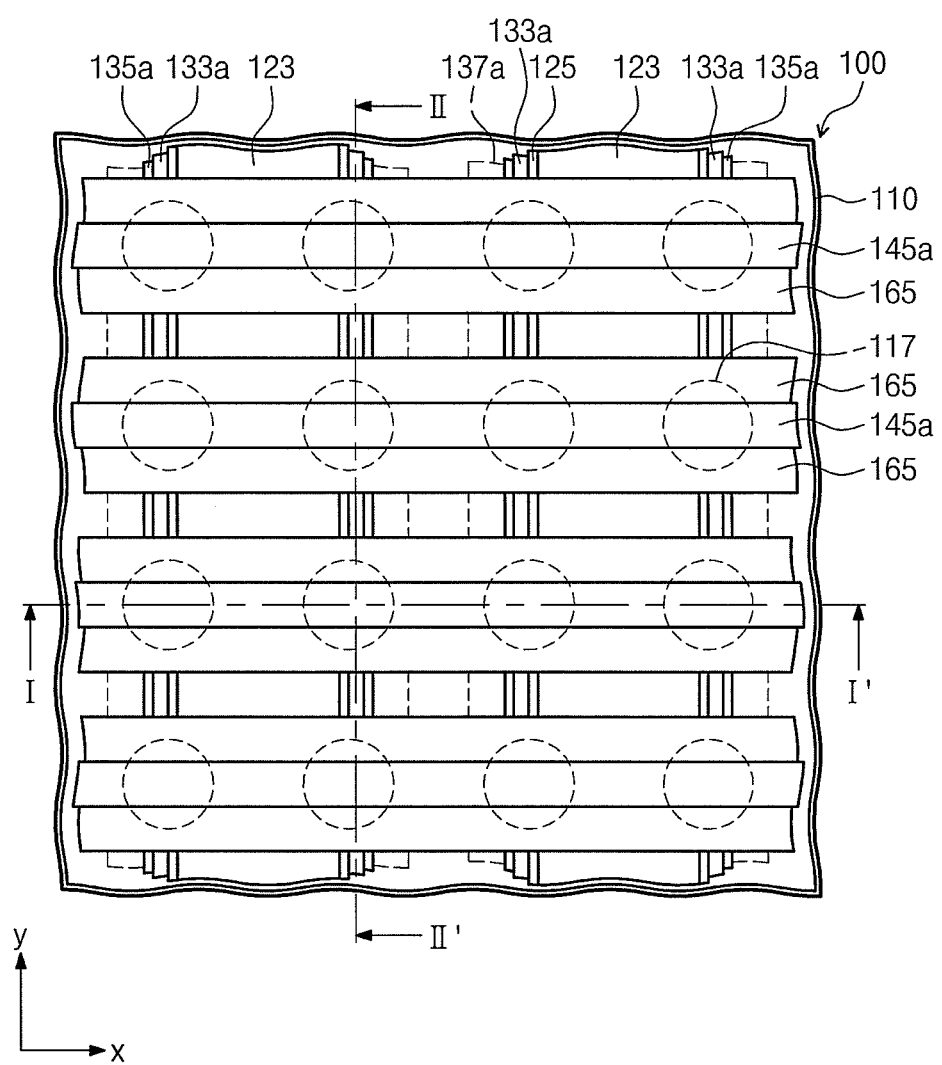
Figure 13B:
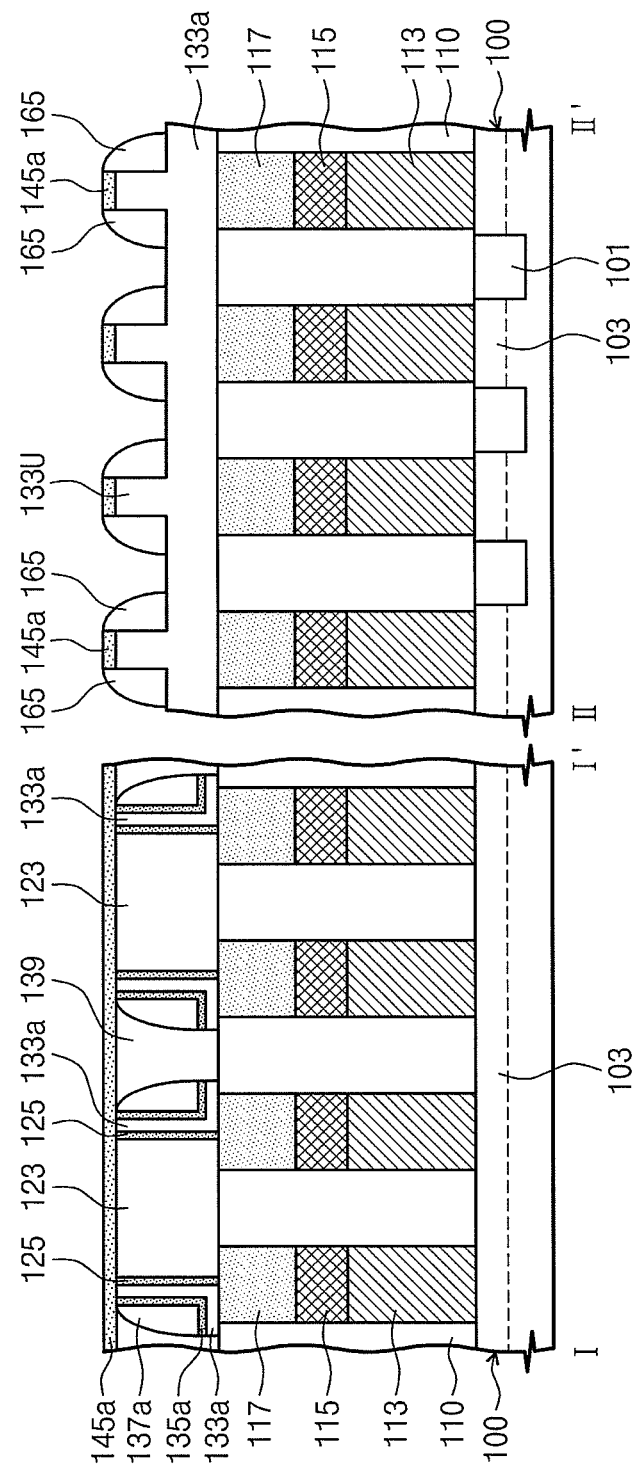

Referring to FIGS. 13A and 13B, the sidewall spacer layer 160 may be anisotropically etched to form a pair of sidewall spacers 165 on either sidewall of each of the first recessed regions 132. The sidewall spacers 165 may be formed by anisotropically etching the sidewall spacer layer 160 until bottom surfaces of the first recessed regions 132 are exposed or surfaces of the electrode patterns 133*a* in the first recessed regions 132.

In an embodiment, while the sidewall spacer layer 160 is anisotropically etched, a portion of each of the mask patterns 145 may be etched to form etched mask patterns 145*a*. In this case, the sidewall spacers 165 may cover both sidewalls of the etched mask patterns 145*a*.

Figure 14A:
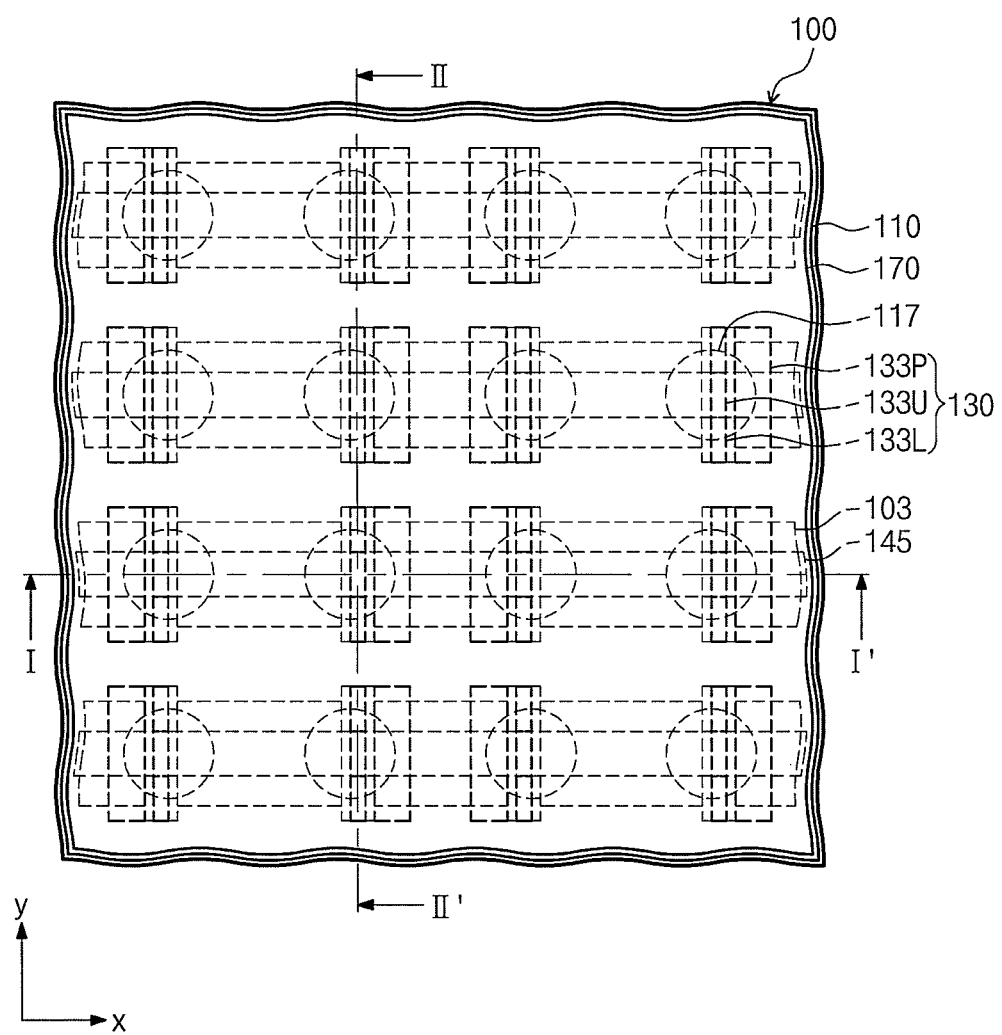
Figure 14B:
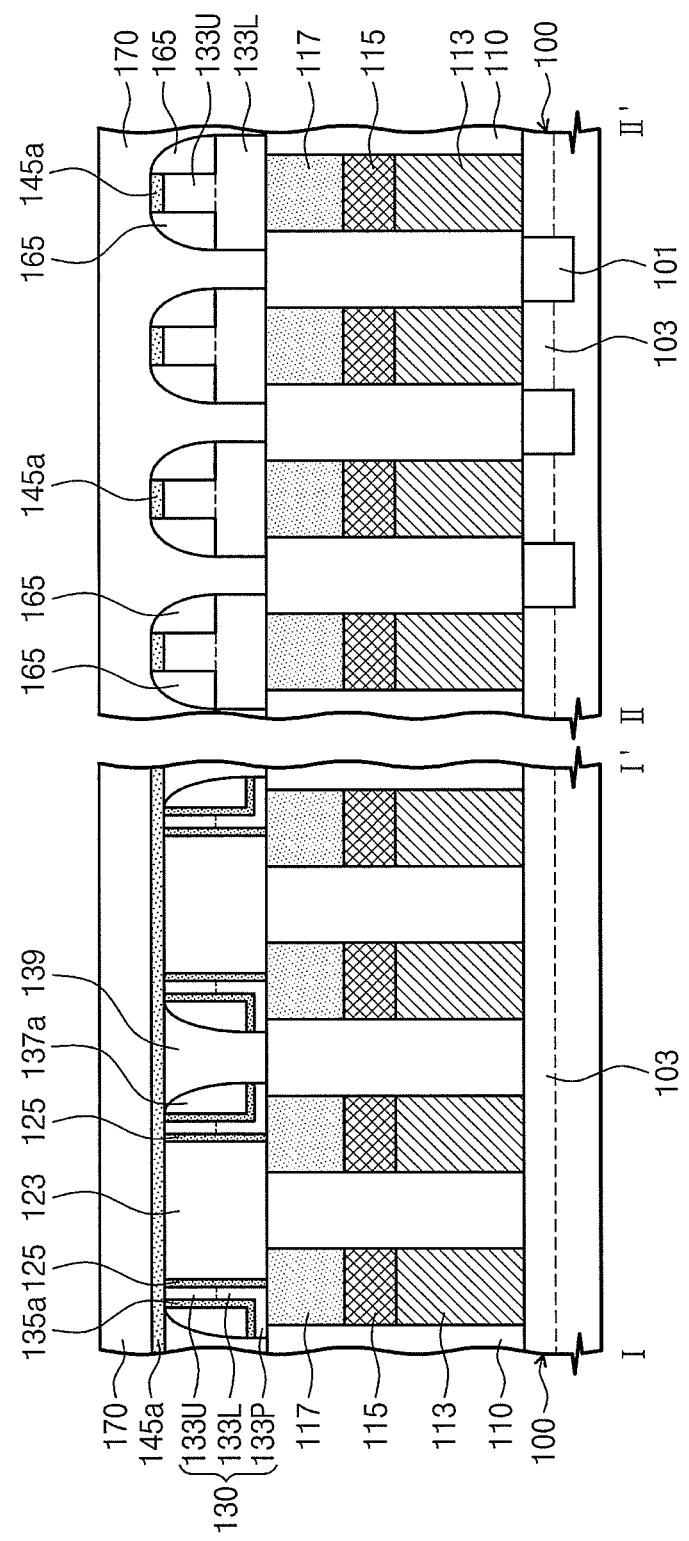

Referring to FIGS. 14A and 14B, using the sidewall spacers 165 and the etched mask patterns 145*a* as etch masks, the electrode patterns 133*a* of FIG. 13B may be etched to expose the first interlayer dielectric layer 110, forming heating electrodes 130.

Each of the heating electrodes 130 may include a first portion 133L, a second portion 133U and a plate portion 133P. The each electrodes 130 may have an L-shaped cross section structure taken along I-I' and a reversed T-shaped cross section structure taken along II-II'. The L-shaped structure may show the plate portion 133P and the first and the second portions 113L and 133U. The reversed T-shaped structure may show the first and the second portions 113L and 133U.

In the L-shaped structure, the plate portion 133P may extend from a lower end of the first portion 133L in the first direction. The second portion 133U may be configured to upwardly protrude from a central region of the first portion 133L. A width of the second portion 133U along the first direction may be substantially equal to a width of the first portion 133L along the first direction. In the reversed T-shaped structure, width of the first portion 133L along the second direction may be greater than a width of the second portion 133U along the second direction.

The heating electrodes 130 may be two dimensionally arrayed in rows and in columns on the first interlayer dielectric layer 110. The heating electrodes 130 may be electrically connected to the corresponding conductive pads 117.

A second interlayer dielectric layer 170 may be formed on the substrate including the heating electrodes 130. The second interlayer dielectric layer 170 may include at least one of an oxide layer, a nitride layer and oxynitride layer.

Figure 15A:
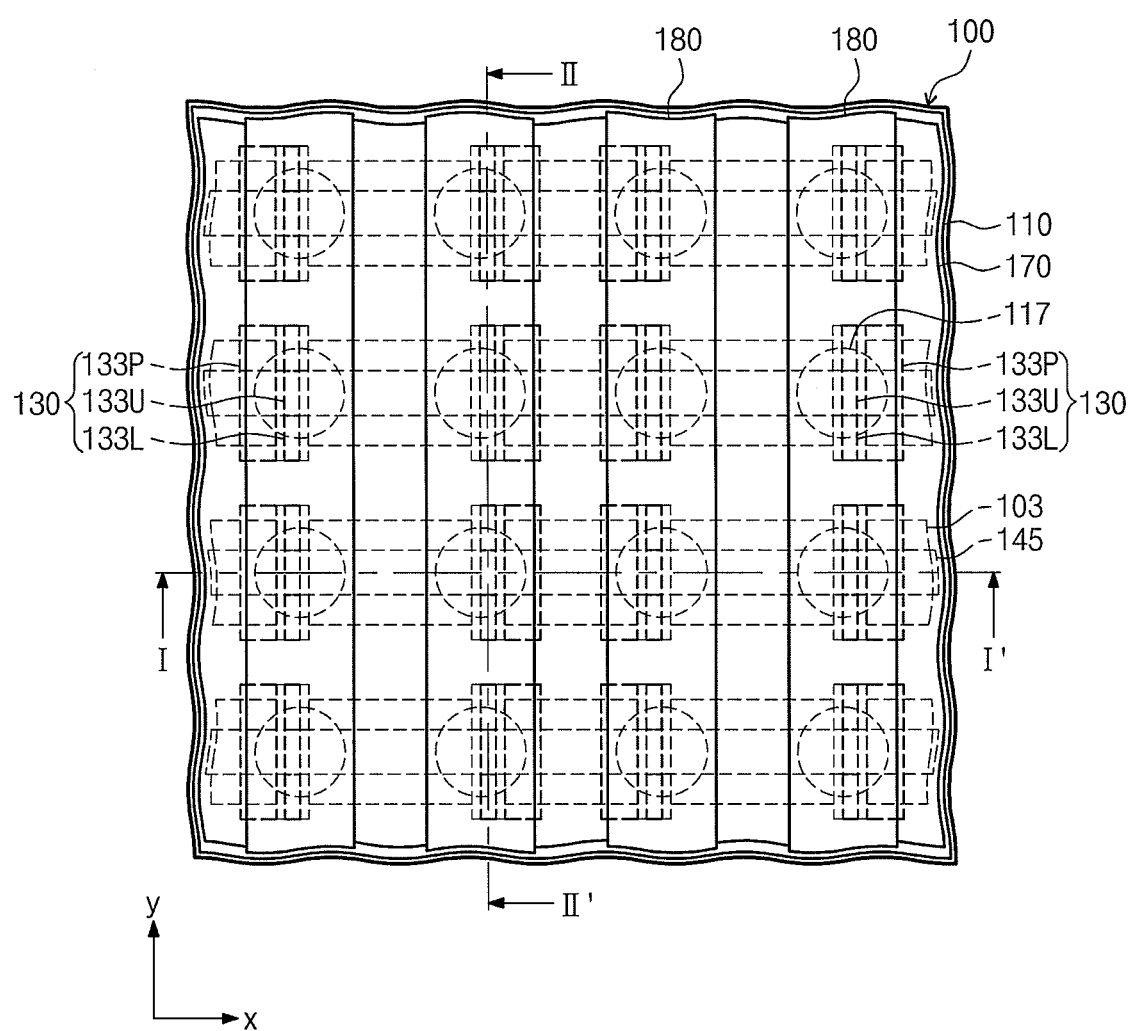
Figure 15B:
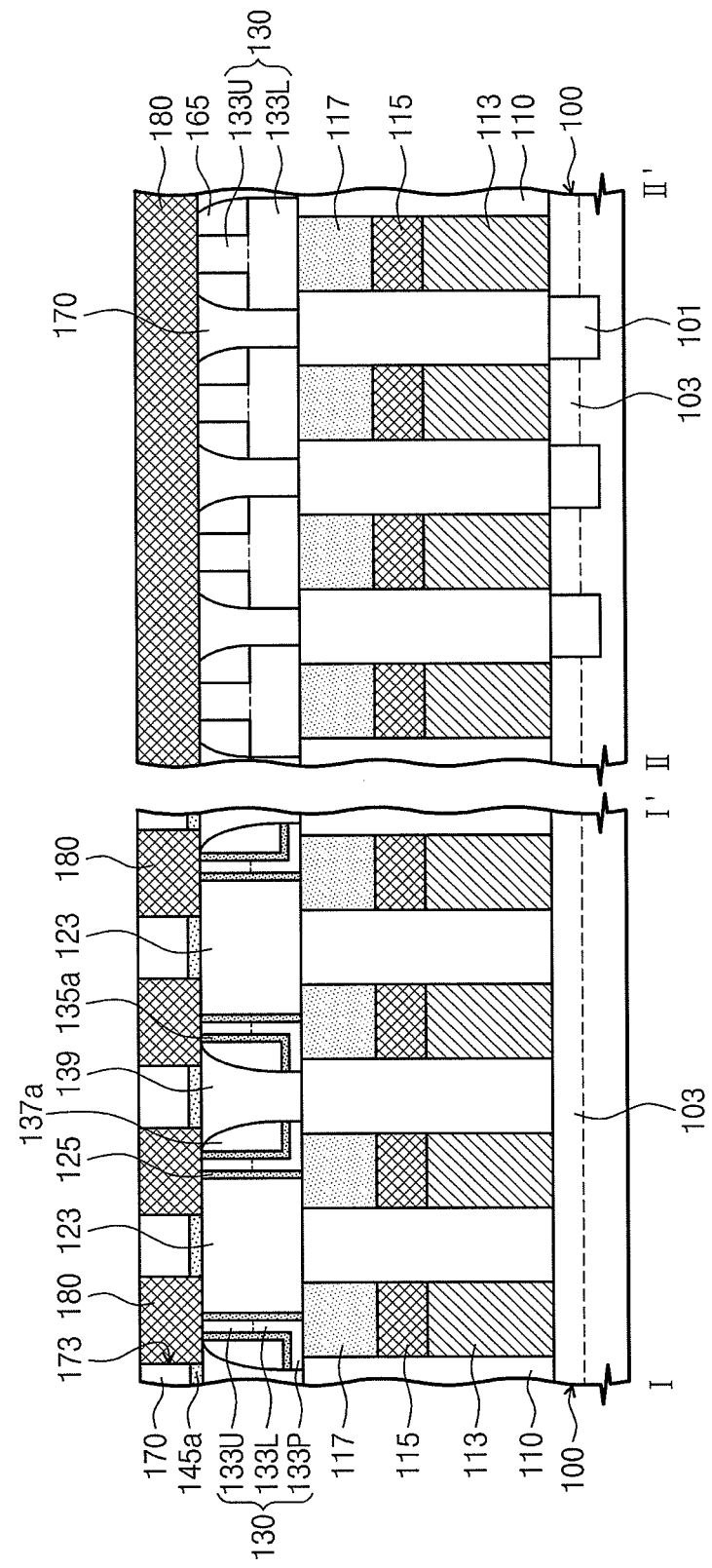

Referring to FIGS. 15A and 15B, the second interlayer dielectric layer 170 and the etched mask patterns 145*a* may be patterned to form trenches 173 exposing top surfaces of the second portions 133U of the heating electrodes 130. Each of the trenches 173 may be formed to have a line shape extending in the second direction. Each of the trenches 173 may expose the top surfaces of the second portions 133U of the heating electrodes 130.

Variable resistive patterns 180 may be formed in the trenches 173. A variable resistive material may be deposited on the surfaces of the second interlayer dielectric layer 170 and the trenches 173. Then, the variable resistive material may be planarized until a top surface of the second interlayer dielectric layer 170 and thereby form the variable resistive patterns 180 that are spaced apart from each other in the trenches 173. The variable resistive patterns 180 may have a line shape extending in the second direction. In an embodiment, etching the variable resistive material may be performed using a chemical mechanical polishing (CMP) process or an etch-back process.

In an embodiment, the variable resistive patterns 180 may be formed of a phase change material. The phase change material of the variable resistive patterns 180 may be formed of a compound material including at least one of chalcogenide elements, for example, tellurium (Te) and selenium (Se). In addition, the phase change material may be formed to further include at least one of germanium (Ge), stibium (Sb), bismuth (Bi), lead (Pb), tin (Sn), silver (Ag), arsenic (As), sulfur (S), silicon (Si), phosphorus (P), oxygen (O) and nitrogen (N). For example, the variable resistive patterns 180 may include at least one of a Ge—Sb—Te compound material, an As—Sb—Te compound material, an As—Ge—Sb—Te compound material, a Sn—Sb—Te compound material, a Ag—In—Sb—Te compound material, a In—Sb—Te compound material, a 5A group element —Sb—Te compound material, a 6A group element —Sb—Te compound material, a 5A group element —Sb—Se compound material and a 6A group element —Sb—Se compound material.

As illustrated in FIGS. 1A and 1B, a capping electrode 193 and an interconnection line 195 may be then formed on each of the variable resistive patterns 180.

According to the embodiment described above, width of the first portion 133L along the second direction is different from a width of the second portion 133U along the second direction. The second direction width of the first portion 133L contacting the conductive pad 117 is greater than the second direction width of the second portion 133U contacting the variable resistive pattern 180. Thus, a first contact area where and the second portion 133U contacts the variable resistive pattern 180 may be reduced by controlling the width of the first and second directions. Meanwhile, a second contact area where the plate portion 133P contact the conductive pad 117 may be independently controlled and have enough area to secure a pre-determined low contact resistance. Consequently, a high reliable semiconductor device may be realized.

Figure 16A:
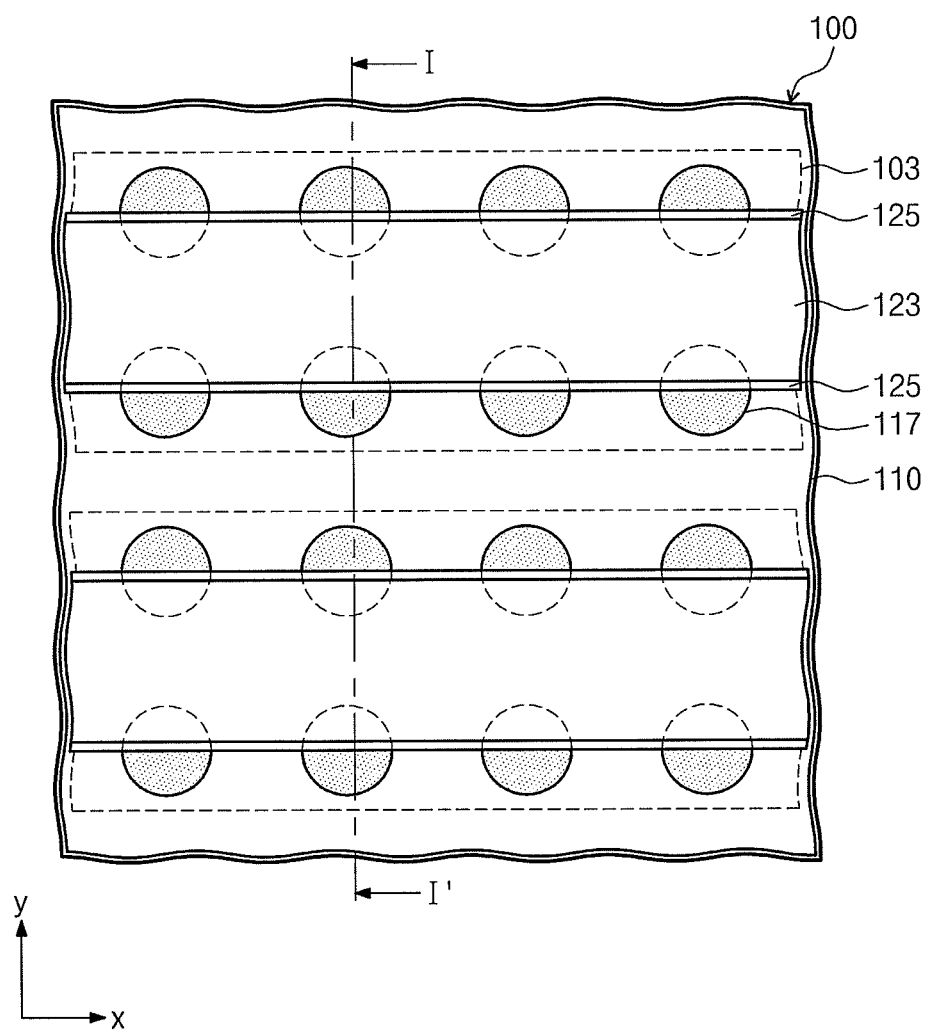
FIG. 16A is a plan view illustrating an embodiment of methods of forming semiconductor memory devices according to embodiments of the inventive concept.
Figure 16B:
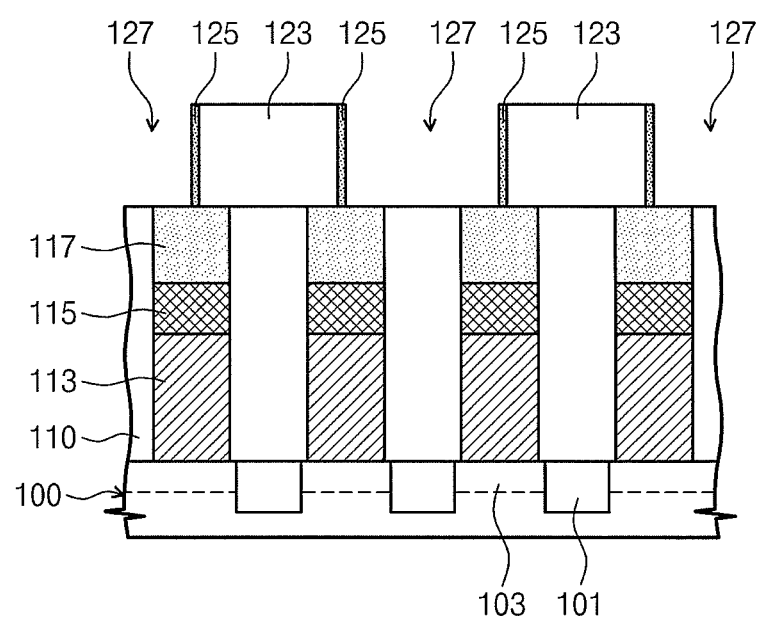
FIG. 16B is a cross sectional view taken along a line I-I' of FIG. 16A to illustrate an embodiment of methods of forming semiconductor memory devices according to embodiments of the inventive concept.

In another embodiment of FIGS. 16A and 16B, the mold patterns 123 may be formed to have a line shape which is parallel with the first direction. That is, all of the active regions and the mold patterns 123 may be formed to be parallel with the first direction. In the event that the mold patterns 123 are formed to be parallel with the first direction, the heating electrodes 130 may be rotated 90 degrees in a plan view to have the configuration of the heating electrodes 130' illustrated in FIGS. 2A and 2B. Other components may have the same configurations as those described above.

Figure 17A:
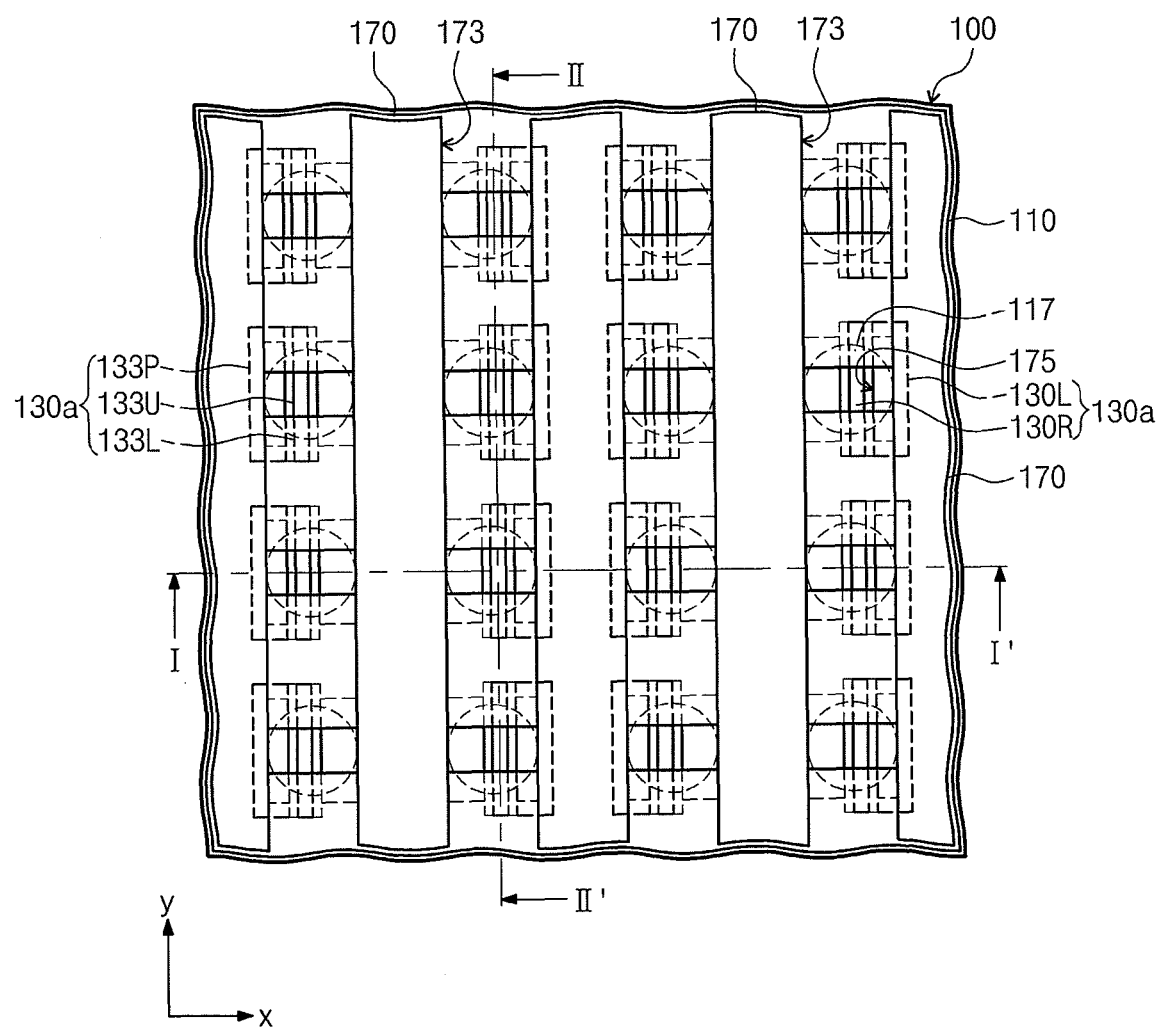
FIGS. 17A and 18A are plan views illustrating another embodiment of methods of forming semiconductor memory devices according to embodiments of the inventive concept.
Figure 17B:
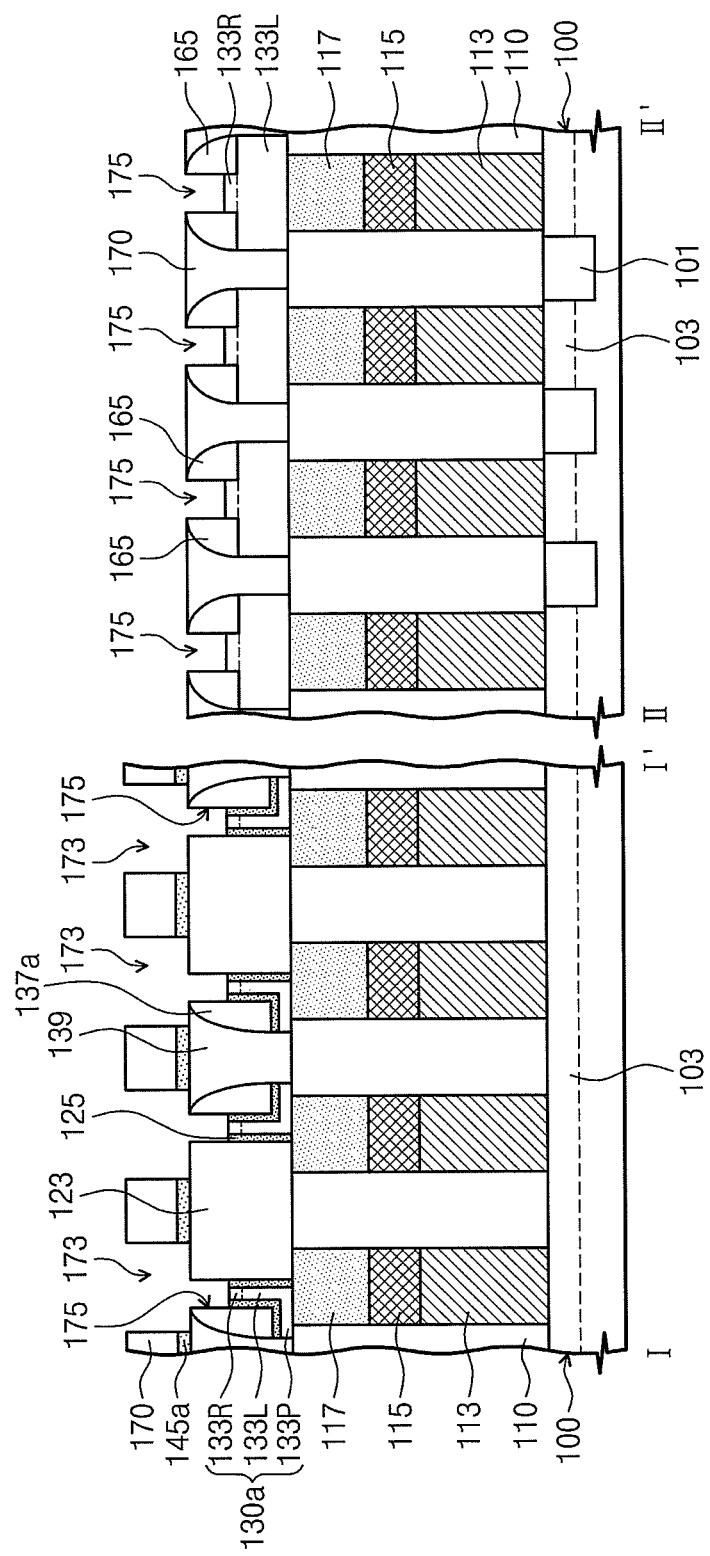
FIGS. 17B and 18B are merged cross sectional views taken along lines I-I' and II-II' of FIGS. 17A and 18A, respectively, to illustrate another embodiment of methods of forming semiconductor memory devices according to embodiments of the inventive concept.
Figure 18A:
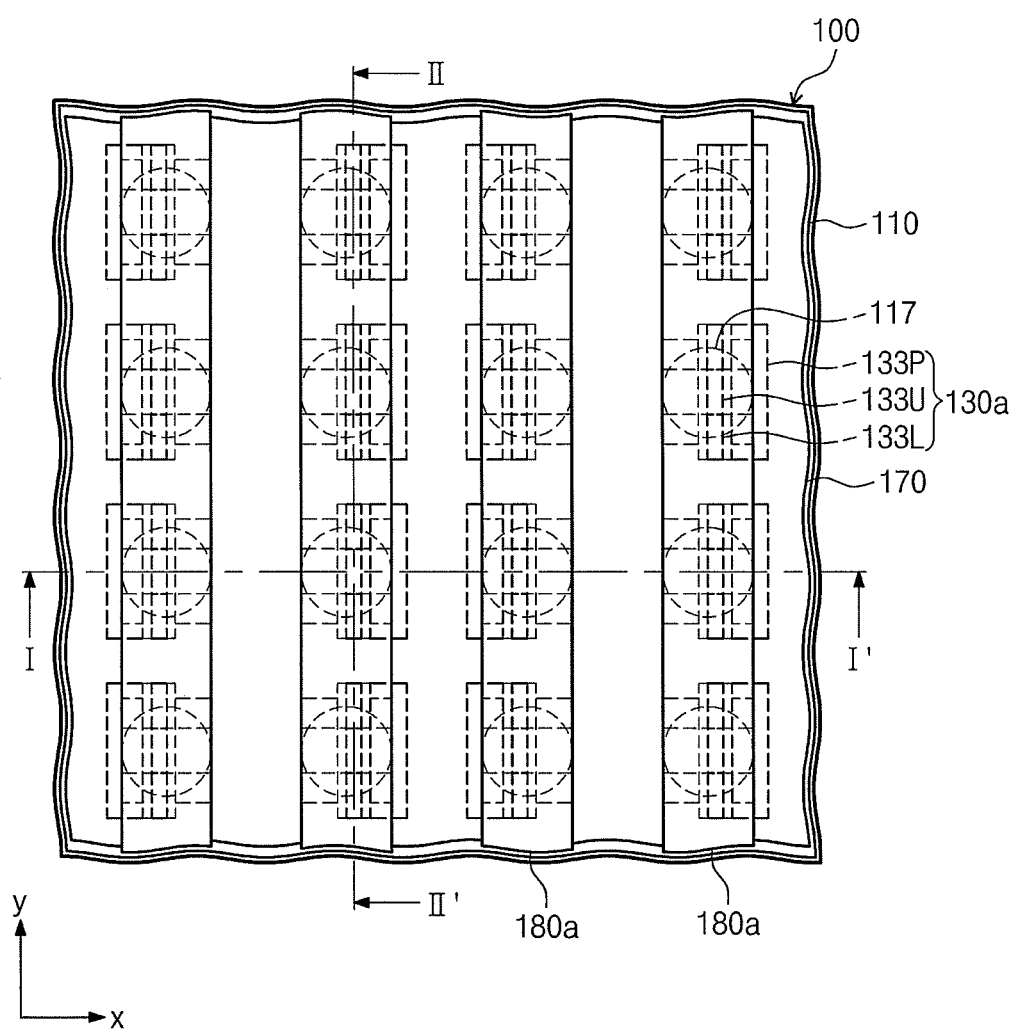
Figure 18B:
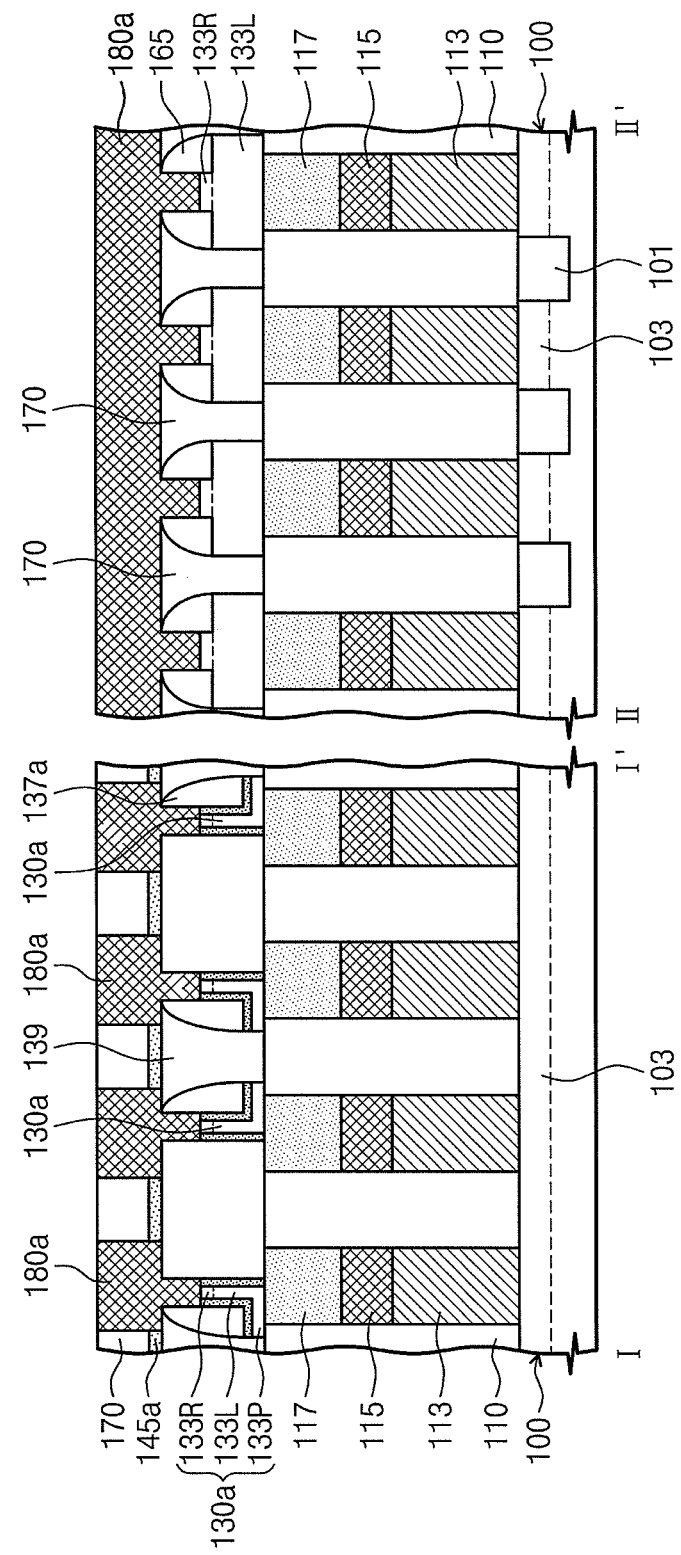

In yet another embodiment, a semiconductor device may include variable resistive patterns having different shapes from the variable resistive patterns described in the previous embodiment. FIGS. 17A and 18A are plan views illustrating another embodiment of methods of forming semiconductor memory devices according to embodiments of the inventive concept. FIGS. 17B and 18B are merged cross sectional views taken along lines I-I' and II-II' of FIGS. 17A and 18A, respectively.

Referring to FIGS. 17A and 17B, the heating electrodes 130, the mold patterns 123, the filling dielectric patterns 139, the etched mask patterns 145*a* and the second interlayer dielectric layer 170 may be formed over the substrate 100 using the same methods as described with reference to FIGS. 5A to 14A and FIGS. 5B to 14B. Further, the second interlayer dielectric layer 170 and the etched mask patterns 145*a* may be patterned to form the trenches 173 extending in the second direction using the same methods as described with reference to FIGS. 15A and 15B. The second portions 133U of the heating electrodes 130 exposed by the trenches 173 may be partially etched to form etched second portions 133R of the etched heating electrodes 130a, forming second recessed regions 175 between the sidewall spacers 165. Each of the second recessed regions 175 may be defined by a top surface of the etched second portion 133R, the mold pattern 123, the mold spacer 137a and a pair of sidewall spacers 165.

Referring to FIGS. 18A and 18B, variable resistive patterns 180a may be formed to fill the trenches 173 and the second recessed regions 175. The variable resistive patterns 180a may be formed to have a line shape extending in the second direction. The heating electrodes 130a may be connected to any one of the variable resistive patterns 180a. Each of the variable resistive patterns 180a may have a plurality of extensions protruding downwardly. The extensions of the variable resistive patterns 180a may be formed to fill the second recessed regions 175. That is, each of the extensions of the variable resistive patterns 180a may be surrounded by the mold pattern 123, the mold spacer 137a and the pair of sidewall spacers 165. A second direction width of the extensions of the variable resistive patterns 180a may be substantially equal to a second direction width of the second portions 133R of the heating electrodes 130a. In an embodiment, the extensions of the variable resistive patterns 180a may contact the top surfaces of the etched second portions 133R of the heating electrodes 130a.

The variable resistive patterns 180a may include the same material as the variable resistive patterns 180 described in the previous embodiment. That is, the variable resistive patterns 180a may include a phase change material.

The capping electrode 193 and the interconnection line 195 may be then formed on each of the variable resistive patterns 180a, as illustrated in FIGS. 3A and 3B.

The present embodiment may exhibit the same effects as the embodiment described with reference to FIGS. 5A to 15A and FIGS. 5B to 15B. In addition, the variable resistive pattern 180a of the semiconductor memory device according to the present embodiment may include the extensions filling the recessed regions 175. Each of the recessed regions 175 is defined by an uppermost surface of the heating electrode 130a, the mold pattern 123, the mold spacer 137a and the pair of sidewall spacers 165. Thus, the extensions of the variable resistive patterns 180a may be self-aligned with the uppermost surfaces of the heating electrodes 130a. Consequently, the alignment margin between the variable resistive patterns 180a and the heating electrodes 130a can be improved.

Figure 19A:
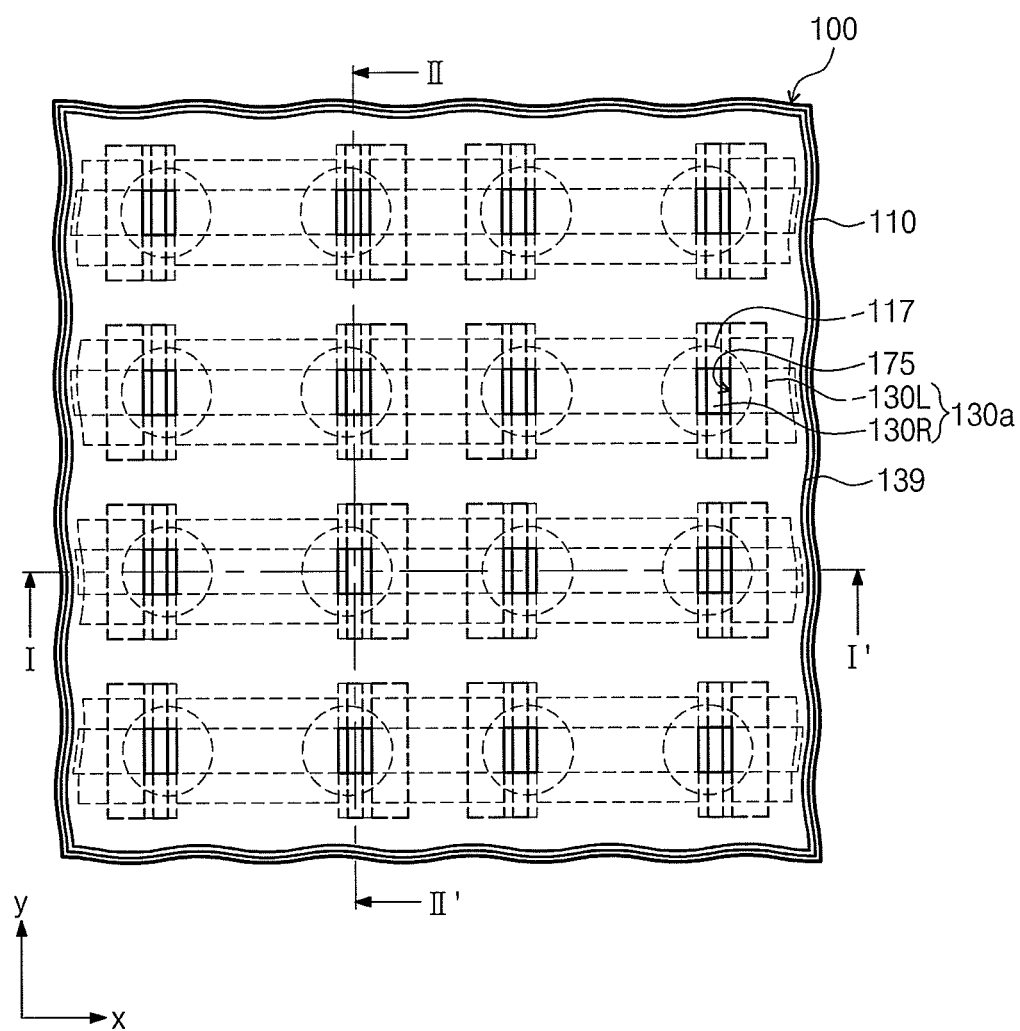
FIGS. 19A and 20A are plan views illustrating still another embodiment of methods of forming semiconductor memory devices according to embodiments of the inventive concept.
Figure 19B:
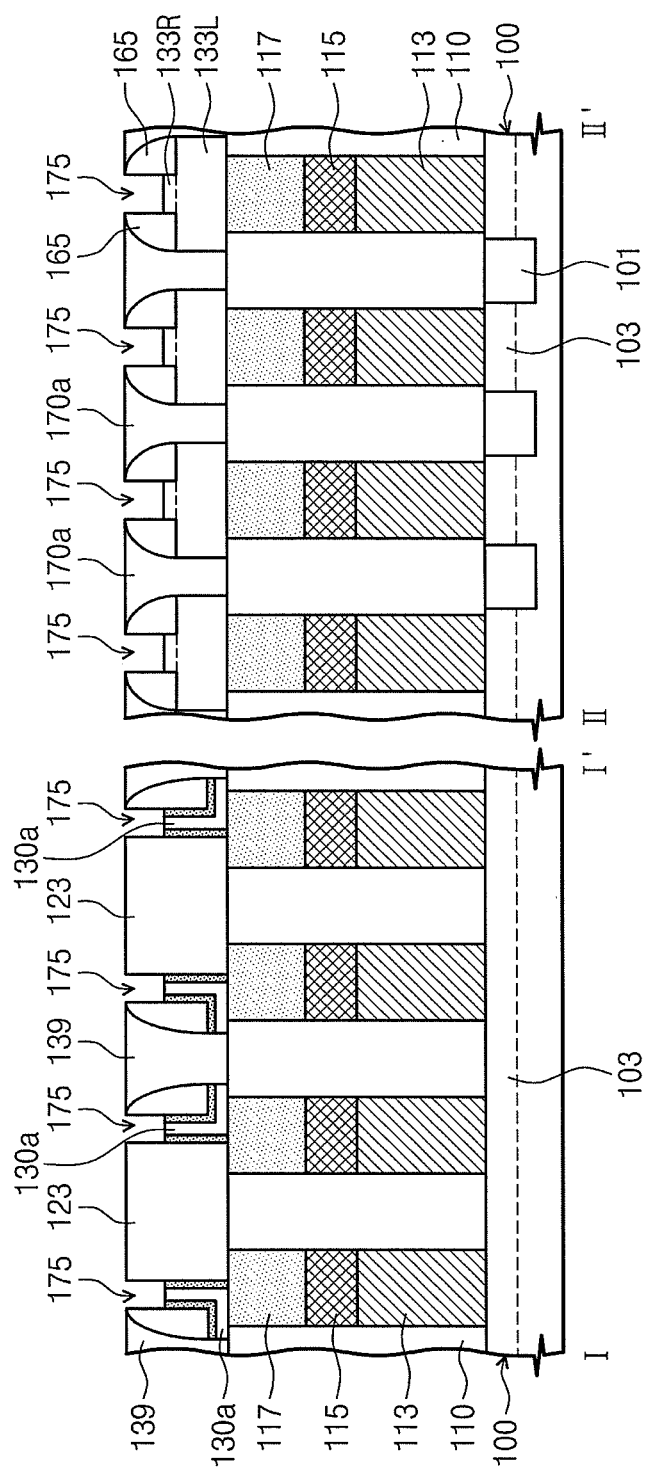
Figure 20A:
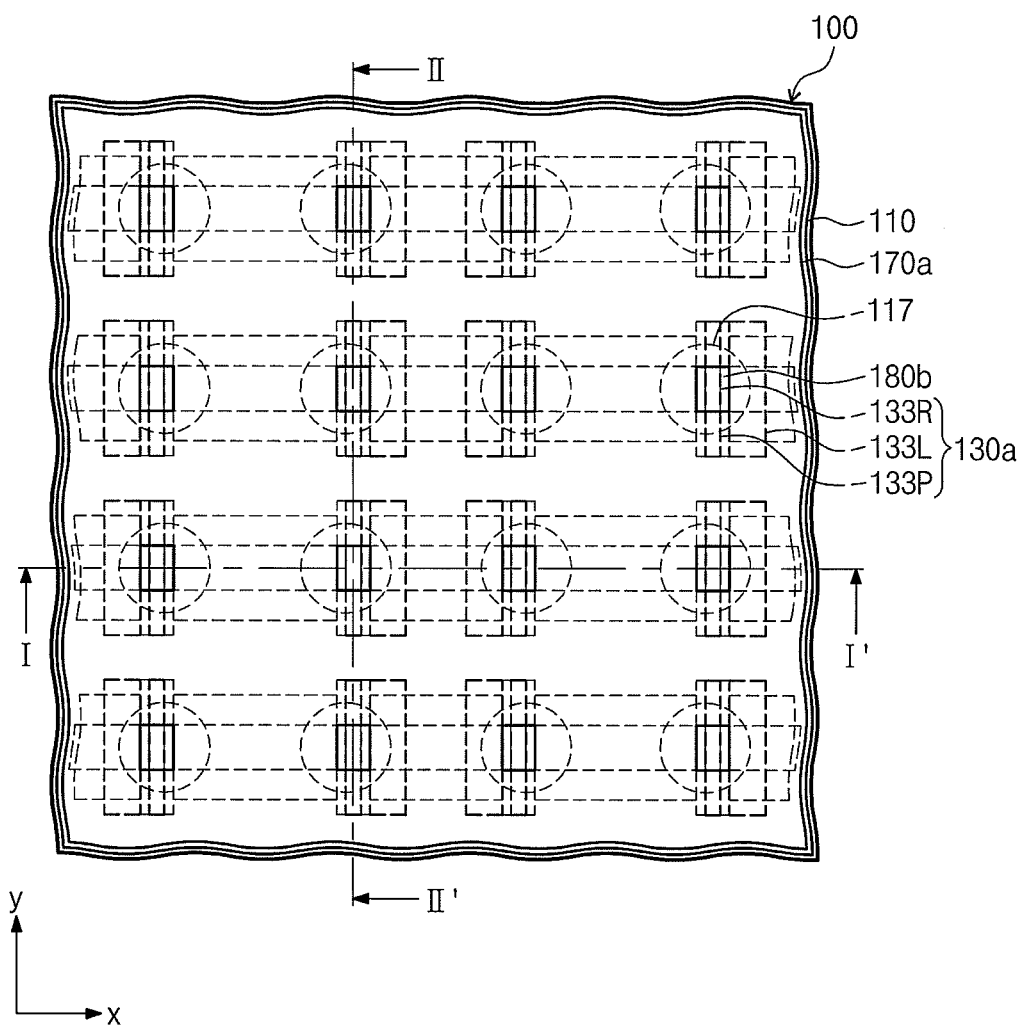

FIGS. 19A and 20A are plan views illustrating still another embodiment of methods of forming semiconductor memory devices according to embodiments of the inventive concept. FIGS. 19B and 20B are merged cross sectional views taken along lines IT and II-II' of FIGS. 19A and 20A, respectively.

The heating electrodes 130, the mold patterns 123, the filling dielectric patterns 139, the etched mask patterns 145a and the second interlayer dielectric layer 170 may be formed over the substrate 100 using the same methods as described with reference to FIGS. 5A to 14A and FIGS. 5B to 14B. The second interlayer dielectric layer 170 may be planarized until the etched mask patterns 145a are exposed, thereby forming a planarized second interlayer dielectric layer 170a. A top surface of the planarized second interlayer dielectric layer 170a may be coplanar with the uppermost ends of the sidewall spacers 165 and the top surfaces of the mold patterns 123.

After planarization of the second interlayer dielectric layer 170, the etched mask patterns 145a may be removed and upper portions of the second portions 133U of the heating electrodes 130 may be etched to form etched heating electrodes 130a including etched second portions 133R. Consequently, second recessed regions 175 may be provided on the etched second portions 133R. Each of the second recessed regions 175 may be defined by a top surface of the etched second portions 133R, the mold patterns 123, the mold spacers 137a and the pair of sidewall spacers 165.

Referring to FIGS. 20A and 20B, variable resistive patterns 180b may be formed in the second recessed regions 175. The variable resistive patterns 180b may be formed by depositing a variable resistive material filling the second recessed regions 175 on the second interlayer dielectric layer 170a and etching the variable resistive material until a top surface of the second interlayer dielectric layer 170a.

Each of the variable resistive patterns 180b may be surrounded by the mold patterns 123, the mold spacers 137a and the pair of sidewall spacers 165. A second direction width of the variable resistive patterns 180b may be substantially equal to a second direction width of the second portions 133R of the heating electrodes 130a. Top surfaces of the variable resistive patterns 180b may be coplanar with top surfaces of the mold patterns 123 and the filling dielectric patterns 139. Further, the top surfaces of the variable resistive patterns 180b may be coplanar with uppermost ends of the mold spacers 137a and uppermost ends of the sidewall spacers 165. According to the present embodiment, the plurality of variable resistive patterns 180b may be provided over the substrate 100 and may be connected to the corresponding heating electrodes 130a. That is, the variable resistive patterns 180b may be two dimensionally arrayed in rows and columns.

The capping electrode 193 and the interconnection line 195 may be then formed to cover the variable resistive patterns 180b arrayed in each of the columns, as illustrated in FIGS. 4A and 4B.

The present embodiment may exhibit the same effects as the embodiment described with reference to FIGS. 17A, 17B, 18A and 18B.

The semiconductor memory devices disclosed in the aforementioned embodiments may be encapsulated using various and diverse packaging techniques. For example, the semiconductor memory devices according to the above embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

Figure 21:
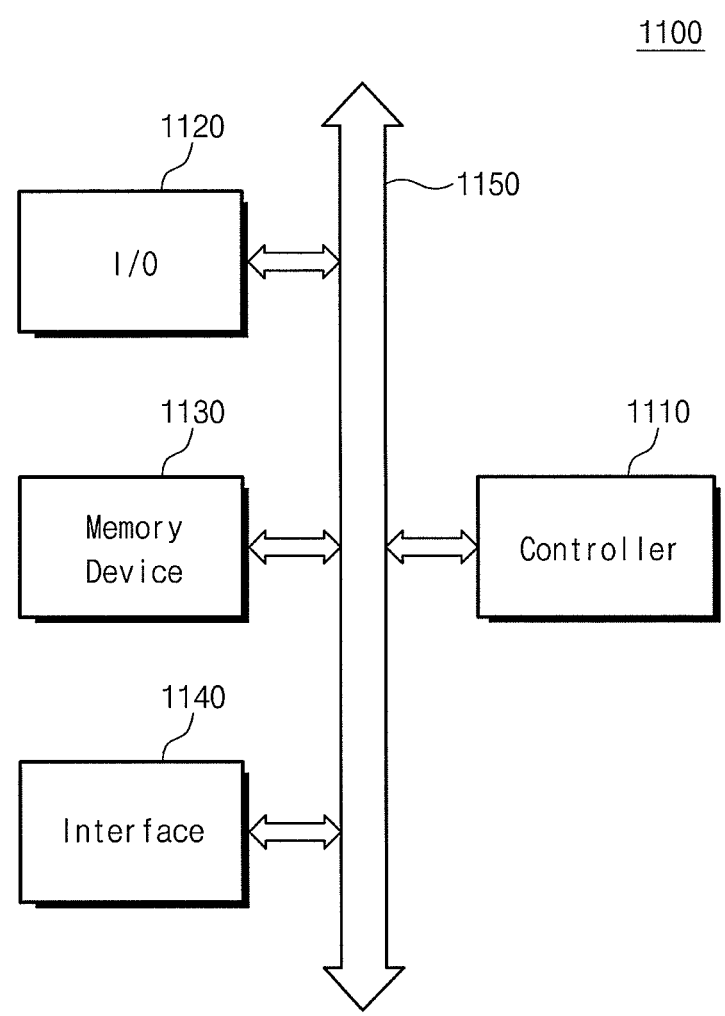
FIG. 21 is a schematic block diagram illustrating an example of electronic systems including at least one of semiconductor memory devices according to embodiments of the inventive concept.

FIG. 21 is a schematic block diagram illustrating an example of electronic systems including semiconductor memory devices according to embodiments of the inventive concept.

Referring to FIG. 21, an electronic system 1100 according to an embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one of the semiconductor memory devices according to the embodiments described above. The memory device 1130 may further include another type of semiconductor memory devices which are different from the semiconductor memory devices described above. For example, the memory device 1130 may further include a magnetic memory device, a phase change memory device, a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data by wireless.

Figure 22:
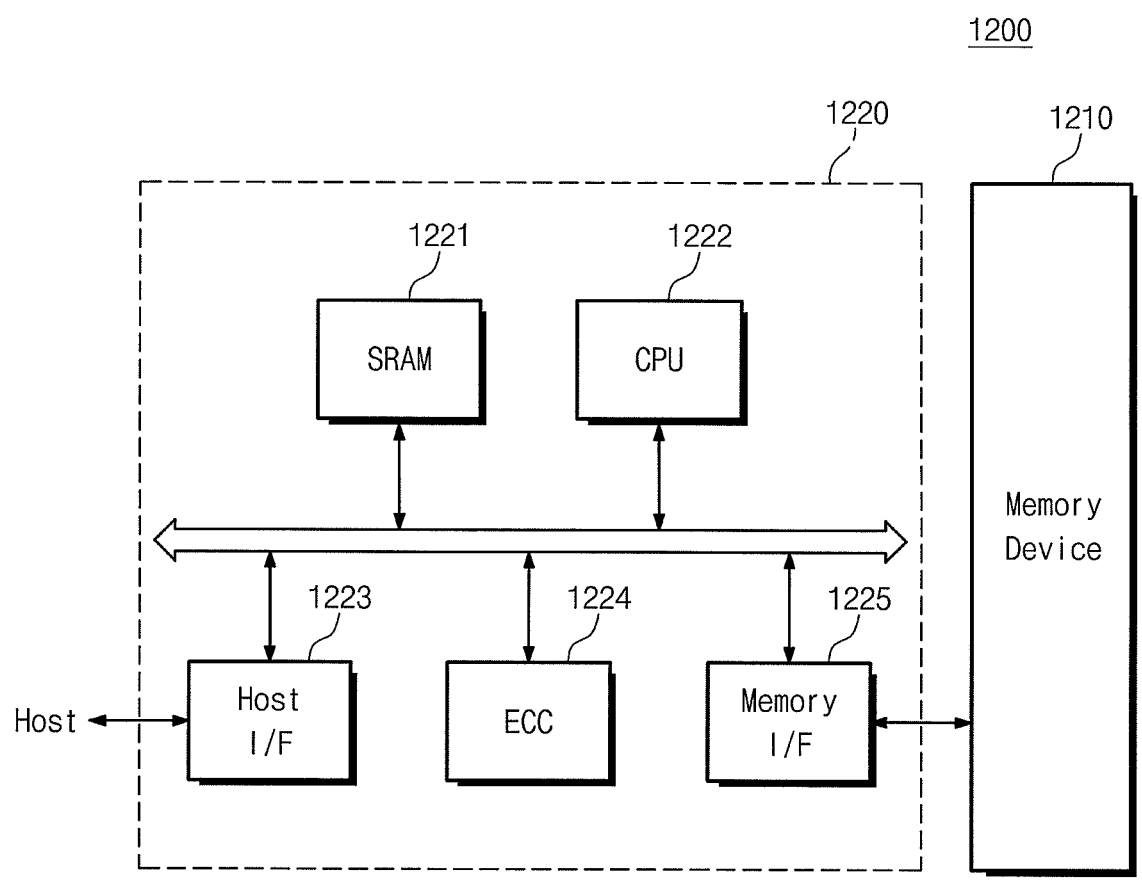
FIG. 22 is a schematic block diagram illustrating an example of memory cards including at least one of semiconductor memory devices according to embodiments of the inventive concept.

FIG. 22 is a schematic block diagram illustrating an example of memory cards including the semiconductor memory devices according to the embodiments of the inventive concept.

Referring to FIG. 22, a memory card 1200 according to an embodiment of the inventive concept may include a memory device 1210. The memory device 1210 may include at least one of the semiconductor memory devices according to the various embodiments mentioned above. In other embodiments, the memory device 1210 may further include another type of semiconductor memory devices which are different from the semiconductor memory devices according to the embodiments described above. For example, the memory device 1210 may further include a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

According to the embodiments set forth above, a heating electrode electrically connected to a variable resistive pattern may include a first portion having a first width and a second width having a second width which is less than the first width. The first portion of the heating electrode contacts a conductive pad electrically connected to a selection element, and the second portion of the heating electrode contacts the variable resistive pattern. That is, a contact area between the heating electrode and the variable resistive pattern can be reduced whereas increase of a contact resistance between the conductive pad and the heating electrode is suppressed. Thus, a high reliable semiconductor device may be realized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor memory device comprising:
   a variable resistive pattern;
   a lower electrode structure; and
   a heating electrode comprising:
      a first portion extending in a first direction,
      a second portion upwardly protruding from a central region of a top surface of the first portion and contacting the variable resistive pattern, and
      a plate portion extending from a lower end of the first portion in a second direction perpendicular to the first direction and contacting the lower electrode structure,
      wherein first width of the first portion is equal to that of the second portion, and second width of the second portion is smaller than that of the first portion, wherein the first width of the first and second portions is measured along the second direction, wherein the second width of the first and second portions is measured along the first direction.

2. The semiconductor memory device of claim 1, wherein the variable resistive pattern has a line shape extending in the first direction.

3. The semiconductor memory device of claim 2, wherein the variable resistive pattern includes an extension that downwardly protrudes from a bottom surface of the variable resistive pattern to contact a top surface of the second portion of the heating electrode.

4. The semiconductor memory device of claim 1, further comprising a pair of sidewall spacers located in the first direction and disposed on either sidewalls of the second portion of the heating electrode; a mold spacer located in the second direction and disposed on the plate portion, the first portion, and second portion of the heating electrode.

5. The semiconductor memory device of claim 4, wherein a top surface of the second portion of the heating electrode is substantially coplanar with uppermost ends of the sidewall spacers and the mold spacer.

6. The semiconductor memory device of claim 4, wherein a top surface of the second portion of the heating electrode is located at a lower level than uppermost ends of the sidewall spacers, and wherein the variable resistive pattern is disposed in a recessed region defined by the pair of sidewall spacers and the top surface of the second portion of the heating electrode.

7. The semiconductor memory device of claim 6, wherein a top surface of the variable resistive pattern is substantially coplanar with the uppermost ends of the sidewall spacers.

8. The semiconductor memory device of claim 1, wherein the lower electrode includes a conductive pad and an ohmic pattern, the conductive pad being disposed between the plate portion and the ohmic pattern.

9. The semiconductor memory device of claim 8, further comprising: a selection element disposed between the substrate and the ohmic pattern; and an upper electrode disposed on the variable resistive pattern.

10. A semiconductor memory device comprising:
   an active region having a first lower electrode structure and a second electrode structure;
   a mold pattern partially disposed on the first lower electrode structure and the second lower electrode structure;
   a pair of heating electrodes disposed on the first lower electrode structure and the second lower electrode respectively, the heating electrodes locating the opposite side of each other, having the mold pattern disposed between the first and the second lower electrode structures, and having a first contact area with the corresponding lower electrode structures; and
   a variable resistive pattern running on the heating electrodes and the mold pattern positioned between the heating electrodes, wherein each heating electrodes has a second contact area with the variable resistive pattern, the second contact being less than the first contact area,
   wherein the heating electrodes have an L-shaped cross-section and a mirror imaged L-shaped cross-section at a first direction, respectively,
   wherein the heating electrodes have an side-down T-shaped cross-section at a second direction perpendicular to the first direction.

11. The semiconductor memory device of claim 10, wherein the L-shaped cross section of the heating electrodes is disposed between a first capping pattern and a second capping pattern, wherein the first capping pattern contacts a sidewall of the mold pattern.

12. The semiconductor memory device of claim 11, wherein a mold spacer is disposed on the second capping pattern.

13. The semiconductor memory device of claim 10, wherein an upwardly protruding portion of the upside-down T-shaped cross section has sidewall spacers on either side of the upwardly protruding portion.

14. The semiconductor memory device of claim 10, further comprising a wordline disposed in an upper region of the active region.

\* \* \* \* \*